United States Patent
Hashimoto et al.

[19]

[11] Patent Number: 5,821,614
[45] Date of Patent: Oct. 13, 1998

[54] CARD TYPE SEMICONDUCTOR DEVICE

[75] Inventors: Nobuaki Hashimoto; Norio Nakamura; Hiroyuki Suemori; Hiroshi Sugai; Norio Imaoka; Kazuyoshi Noake, all of Suwa, Japan

[73] Assignee: Seiko Epson Corporation, Tokyo, Japan

[21] Appl. No.: 435,465

[22] Filed: May 5, 1995

[30] Foreign Application Priority Data

| May 6, 1994 | [JP] | Japan | 6-116099 |
| May 6, 1994 | [JP] | Japan | 6-116100 |
| Feb. 21, 1995 | [JP] | Japan | 7-055192 |

[51] Int. Cl.⁶ .......................... H01L 23/02; G06K 19/06; H05K 1/00
[52] U.S. Cl. .......................... 257/679; 257/712; 257/713; 235/492; 361/686
[58] Field of Search .......................... 257/678, 679, 257/685, 723, 777, 712, 713; 235/492; 361/686

[56] References Cited

U.S. PATENT DOCUMENTS

| 4,211,919 | 7/1980 | Ugon . |
| 4,295,041 | 10/1981 | Ugon . |
| 4,388,671 | 6/1983 | Hall et al. . |
| 4,849,944 | 7/1989 | Matsushita . |
| 4,996,766 | 3/1991 | Piorunneck et al. . |
| 5,003,273 | 3/1991 | Oppenberg . |
| 5,093,985 | 3/1992 | Houldsworth et al. . |
| 5,097,388 | 3/1992 | Buist et al. . |
| 5,162,979 | 11/1992 | Anzelone et al. . |
| 5,191,404 | 3/1993 | Wu et al. .......................... 257/723 |
| 5,281,852 | 1/1994 | Normington .......................... 257/686 |
| 5,319,516 | 6/1994 | Perkins . |
| 5,331,509 | 7/1994 | Kikinis . |
| 5,335,145 | 8/1994 | Kusui . |
| 5,371,653 | 12/1994 | Kametani et al. . |
| 5,373,149 | 12/1994 | Rasmussen .......................... 361/686 |
| 5,481,432 | 1/1996 | Tsukada et al. . |
| 5,502,617 | 3/1996 | Tsukada et al. . |

FOREIGN PATENT DOCUMENTS

| 552 042 A1 | 7/1993 | European Pat. Off. . |
| 43 29 335 A1 | 3/1994 | Germany . |

OTHER PUBLICATIONS

"386SL CPU Board Measures 4 by 4 in." *Electronic Design*, 131 Aug. 5, 1993.

*Primary Examiner*—Carl W. Whitehead
*Attorney, Agent, or Firm*—Oliff & Berridge, PLC

[57] ABSTRACT

A card type semiconductor device includes a main circuit board and a first sub-circuit-board equipped with a main memory. The main circuit board is connected to the first sub-circuit-board through an FPC. A first TCP equipped with the CPU and a second TCP equipped with the I/O subsystem chip are mounted on the top and bottom surfaces of the main circuit board. The first and second TCPs are mounted to directly oppose each other. The card type semiconductor device is used as a card type computer. The main circuit board and the sub-circuit-board face each other by bending the FPC and enclosing the main circuit board and the sub-circuit-board in a card-shaped thin housing. The card type semiconductor device achieves a high density packaging in a small form factor. The card type semiconductor device supports high speed operations and provides a structure for adaptation to new applications quickly and inexpensively by allowing easy replacement of the sub-circuit-board with other sub-circuit boards that perform a wide range of functions.

38 Claims, 17 Drawing Sheets

| 1 | GND | 119 | GND |
|---|---|---|---|
| 2 | GND | 120 | GND |
| 3 | RESERVE | 121 | FPDOTCLK |
| 4 | LD6 | 122 | LD7 |
| 5 | LD4 | 123 | LD5 |
| 6 | LD2 | 124 | LD3 |
| 7 | LD0 | 125 | LD1 |
| 8 | FPVTIM | 126 | FPHTIM |
| 9 | FPAC | 127 | LD8 |
| 10 | FPVCCON | 128 | FPVEEON |
| 11 | RESERVE | 129 | FPBLANK |
| 12 | RESERVE | 130 | RESERVE |
| 13 | RESERVE | 131 | RESERVE |
| 14 | RESERVE | 132 | RESERVE |
| 15 | BLUE | 133 | BRTN |
| 16 | GREEN | 134 | GRTN |
| 17 | RED | 135 | RRTN |
| 18 | VSYNC | 136 | HSYNC |
| 19 | ANIN1 | 137 | ANIN0 |
| 20 | ANIN3 | 138 | ANIN2 |
| 21 | MSDATA | 139 | MSCLK |
| 22 | KBDATA | 140 | KBCLK |
| 23 | FDWP# | 141 | FDRD# |
| 24 | FDINDEX# | 142 | FDDCHG# |
| 25 | FDTRK0# | 143 | FDWE# |
| 26 | FDWD# | 144 | FDHIDEN |
| 27 | VCC | 145 | VCC |
| 28 | VCC | 146 | VCC |

FIG.17

| | | | |
|---|---|---|---|
| 29 | VCC(INTERNAL) | 147 | VCC(INTERNAL) |
| 30 | VCC(INTERNAL) | 148 | VCC(INTERNAL) |
| 31 | FDDS2# | 149 | FDDS1# |
| 32 | FDMT2# | 150 | FDMT1# |
| 33 | FDSIDE | 151 | FDSTEP# |
| 34 | FDDIR | 152 | RESERVE |
| 35 | RESERVE | 153 | RESERVE |
| 36 | COMBDTR# | 154 | COMBRI# |
| 37 | COMBCTS# | 155 | COMBRXD |
| 38 | COMBRTS# | 156 | COMBTXD |
| 39 | COMBDSR# | 157 | COMBDCD# |
| 40 | COMADTR# | 158 | COMARI# |
| 41 | COMACTS# | 159 | COMARXD |
| 42 | COMARTS# | 160 | COMATXD |
| 43 | COMADSR# | 161 | COMADCD# |
| 44 | RESERVE | 162 | RESERVE |
| 45 | LPTSTROBE# | 163 | LPTAFD# |
| 46 | LPTD0 | 164 | LPTERROR# |
| 47 | LPTACK# | 165 | LPTBUSY |
| 48 | LPTPE | 166 | LPTSLCT |
| 49 | LPTD1 | 167 | LPTINIT# |
| 50 | LPTD2 | 168 | LPTSLTCIN# |
| 51 | LPTD3 | 169 | LPTD4 |
| 52 | LPTD5 | 170 | LPTD6 |
| 53 | LPTD7 | 171 | LPTDIR |
| 54 | HDIR | 172 | HD7 |
| 55 | HDENL# | 173 | HDENH# |
| 56 | HDCS0# | 174 | HDCS1# |
| 57 | SUSSTAT# | 175 | VBAK |
| 58 | BATLOW# | 176 | EXTSMI# |
| 59 | GND | 177 | GND |

FIG.18

| | | | |
|---|---|---|---|
| 60 | GND | 178 | GND |
| 61 | BATWRN# | 179 | BATDEAD# |
| 62 | POWERGOOD | 180 | SRBTN# |
| 63 | SPKOUT | 181 | RESERVE |
| 64 | FLOAT | 182 | PGM |
| 65 | POMCE0# | 183 | RESERVE |
| 66 | (ISACLK2) | 184 | RESERVE |
| 67 | SD7 | 185 | RESETDRV |
| 68 | SD6 | 186 | IOCHCK# |
| 69 | SD5 | 187 | IRQ9 |
| 70 | SD4 | 188 | DRQ2 |
| 71 | SD3 | 189 | WS0# |
| 72 | SD2 | 190 | SMEMW# |
| 73 | SD1 | 191 | SMEMR# |
| 74 | SD0 | 192 | IOW# |
| 75 | IOCHRDY | 193 | IOR# |
| 76 | AEN | 194 | DACK3# |
| 77 | SA19 | 195 | DRQ3 |
| 78 | SA18 | 196 | DACK1# |
| 79 | SA17 | 197 | DRQ1 |
| 80 | SA16 | 198 | REF# |
| 81 | SA15 | 199 | SCLK |
| 82 | VCC(INTERNAL) | 200 | VCC(INTERNAL) |
| 83 | VCC(INTERNAL) | 201 | VCC(INTERNAL) |

| 84 | VCC | 202 | VCC |
|---|---|---|---|
| 85 | VCC | 203 | VCC |
| 86 | SA14 | 204 | IRQ7 |
| 87 | SA13 | 205 | IRQ6 |
| 88 | SA12 | 206 | IRQ5 |
| 89 | SA11 | 207 | IRQ4 |
| 90 | SA10 | 208 | IRQ3 |
| 91 | SA9 | 209 | DACK2# |
| 92 | SA8 | 210 | TC |
| 93 | SA7 | 211 | BALE |
| 94 | SA6 | 212 | OSC |
| 95 | SA5 | 213 | MEMCS16# |
| 96 | SA4 | 214 | IOCS16# |
| 97 | SA3 | 215 | IRQ10 |
| 98 | SA2 | 216 | IRQ11 |
| 99 | SA1 | 217 | IRQ12 |
| 100 | SA0 | 218 | IRQ15 |
| 101 | SBHE# | 219 | IRQ14 |
| 102 | LA23 | 220 | DACK0# |
| 103 | LA22 | 221 | DRQ0 |
| 104 | LA21 | 222 | DACK5# |
| 105 | LA20 | 223 | DRQ5 |
| 106 | LA19 | 224 | DACK6# |
| 107 | LA18 | 225 | DRQ6 |
| 108 | LA17 | 226 | DACK7# |
| 109 | MEMR# | 227 | DRQ7 |
| 110 | MEMW# | 228 | MASTER# |
| 111 | SD8 | 229 | SD12 |
| 112 | SD9 | 230 | SD13 |
| 113 | SD10 | 231 | SD14 |
| 114 | SD11 | 232 | SD15 |
| 115 | SMOUT3 | 233 | SMOUT2 |
| 116 | SMOUT1 | 234 | SMOUT0 |
| 117 | GND | 235 | GND |
| 118 | GND | 236 | GND |

CARD TYPE SEMICONDUCTOR DEVICE

BACKGROUND OF THE INVENTION

1. Field of The Invention

The invention relates to a card type semiconductor device packaging structure and a method for manufacturing the same.

2. Description of The Related Art

Microcomputer technology is incorporated into a wide variety of products such as cellular telephones, audio/video equipments, automatic machine tools, automobiles, medical instruments industrial control systems, vending machines, automatic cash dispensers, etc. Generally, a high proportion of the incorporated computers is specifically designed and manufactured for a particular application based on the operating conditions of the end product. Since each computer application is unique, new applications cannot take advantage of previous development efforts. Thus, each new system must bear the cost for the development of new designs and the associated manufacturing time delays. However, when a standard computer architecture, such as the IBM PC/AT, for example, is used, savings in both cost and time are possible because a large portion of the design is already completed. In addition, a standard computer system allows further sharing of other related designs.

JP 5-278643 describes a computer system packaged into a single unit by enclosing the computer system in a compact card-like housing. Thus, a general purpose computer system is provided having a predefined shape and structure. Developing new equipment using this general purpose computer package as a building block saves both the cost and time that would have been required to design and manufacture a new computer system.

Conventionally, a printed circuit board is used for such a general purpose computer package by mounting onto the printed circuit board, a CPU, a memory, and other integrated circuits for controlling input/output peripheral devices. By standardizing parameters such as size and shape of the printed circuit board and the card-like housing, the general purpose computer package can be easily applied as a standard building block for a wide variety of equipment designs.

However, when designing and manufacturing a computer system by using the standard building block, it is necessary to establish operating speed, memory capacity and other performance parameters for each application of the computer system. These performance parameters are determined by the functions and conditions required by the end product.

In some applications, such as a control system for an automatic machine tool, changes in the operation of the automatic machine tool from one workpiece to the next can be accommodated by reloading the onboard memory of the computer system. However, when an operation on a workpiece requires a new model of the automatic machine tool, the form factor requirements of the printed circuit board may be modified necessitating a redesign of a new printed circuit board. This defeats the advantages of the standard building block.

The demand for package miniaturization, reduction in weight, decrease in thickness as well as increase in processing speeds has led to the development of various packaging techniques. New methods are developed for connecting electronic components, reducing printed circuit board thickness, and decreasing printed circuit board pattern size. Additional improvements are provided by the employment of multilayer structures and the miniaturization of electronic components. The surface mounting techniques for implementing IC packages such as a quad flat package (QFP) and the bare chip packaging techniques of chip on board (COB) and tape automated bonding (TAB) are some examples of the new methods.

The TAB method using a tape carrier package (TCP) is especially suitable for mass production because the TCP can be connected to a printed circuit board with one operation regardless of the number of leads. Moreover, the TCP allows a narrowing of the lead pitch and thus accommodates large-chip high-pin-count devices. For this reason, the TCP is suitable for high density packaging.

FIG. 21 shows a method for mounting a TCP onto a printed circuit board. The TCP 87 is first put on the printed circuit board 86. Then, outer leads 89 of the TCP 87 are pressed onto lands 90 provided on the printed circuit board 86 by using a bonding tool 88 lowered from above the TCP 87. If necessary, the outer leads 89 are simultaneously heated. The printed circuit board is placed on a flat top surface of a pedestal 91 which supports the printed circuit board 86 from a back surface. Subsequently, the outer leads 89 are connected to the lands 90 by one of soldering and thermocompression while the bonding tool 88 presses the outer leads 89 against the lands 90 with a pressure of about 10 kgf.

When mounting a plurality of TCPs 87 and 92 on both sides of a printed circuit board, TCPs 87 are first mounted on a top surface of the printed circuit board and then, other TCPs 92 are mounted on a bottom surface of the printed circuit board 86. When mounting the TCPs 92 on the bottom surface of the printed circuit board 86, the pedestal 91 must be placed in such a manner as to prevent the TCPs 87 from touching the pedestal 91. Therefore, the TCPs 87 and 92 can not be mounted directly opposing each other on the top and bottom surfaces of the printed circuit board 86. As a result, the areas of both of the top and bottom surfaces of the printed circuit board can not be effectively utilized. Consequently, this conventional mounting method fails to allow mounting a maximum density of TCPs on the printed circuit board 86, thus preventing further miniaturization of the computer system.

When a printed circuit board is multilayered, TCPs can be connected to the interconnecting lines of an internal layer circuit. However, ICs cannot be closely arranged on the printed circuit board because of the problems encountered by the conventional mounting method discussed above.

ICs are connected to a power supply line and a grounding line via through-holes bored in the layers of the printed circuit board. Power supply and grounding lines are usually placed on different layers than the layer that the IC's are mounted. Because the ICs cannot be closely located, undesirable differences in power supply and grounding potentials may occur, thus degrading the operational stability of the computer system. Additionally, because the ICs are not closely located, the lengths of interconnecting lines are long and prevent high-speed operation.

Moreover, when the number of the through-holes is large, a large amount of printed circuit board area is consumed by through-holes. As a result, the conventional mounting method can not meet miniaturization needs.

Furthermore, as packaging density of printed circuit boards increase and heat generated from each IC also increases, it is very important to efficiently dissipate the generated heat to ensure durability of the printed circuit boards and the operational stability of the computer system. When heat dissipating devices such as radiation fins, heat sinks or liquid cooling devices are used, both cost and size of the computer system increases. Consequently, miniaturization is made more difficult.

SUMMARY OF THE INVENTION

The invention solves the above problems of the conventional devices and methods discussed above.

Accordingly, an object of the invention is to provide a card type semiconductor device which easily and quickly adapts to different functional requirements and operating conditions and to easily change memory capacity. Thus, the flexibility and versatility of the card type semiconductor device is ensured and the cost reduced. In addition, the size and thickness of a print circuit board is reduced to form an entire device in a compact unit.

When thermosetting protective resin, used to protect IC chips, is applied to a circuit board on which bare IC-chips are connected at a high density, a deformation such as a warp may appear in the circuit board after the protective resin sets. The invention provides a card type semiconductor device that has a structure which resist this deformation.

A further object of the invention is to provide a card type semiconductor device that has a strong and durable structure so that the card type semiconductor device is both compact and durable meeting field handling requirements.

The high-density packaging, the reduction in size of patterns formed on the circuit board, and the reduction in the power consumption expose the card type semiconductor device to the influences of both externally and internally generated noises. Analog circuit portions such as a floppy disk drive unit, an analog-to-digital (AD) converter and a phase-locked loop (PLL) may become unstable when noise is induced into the lines by the digital circuit portions.

Thus, still another object of the invention is to provide a card type semiconductor device which decreases susceptibility to electrical noise. This provides stable reliable operation, especially for analog circuit portions.

Yet another object of the invention is to provide a flexible and adaptable method for manufacturing the card type semiconductor device which are tailored to special purposes without significantly changing the manufacturing process, thus reducing the manufacturing costs.

A further object of the invention is to provide a card type semiconductor device that is suitable for high density packaging leading to a reduction in size. A plurality of package type IC components are mounted on the top and bottom surfaces of the printed circuit board. The IC components mounted on opposite surfaces of the printed circuit board are in positions directly opposing each other. This arrangement efficiently utilizes the surface area of the printed circuit board, and increases the degrees of freedom for circuit design.

In addition, another object of the invention is to increase the operating speed of the card type semiconductor device and improve the stability and reliability by reducing the lengths of interconnecting lines, especially, among IC chips which interdependently operates with one another.

Another object of the invention is to provide a heat dissipating structure which effectively dissipates heat produced by the IC chips without using expensive heat dissipating devices, thus reducing both size and cost.

An object of the invention is to provide a method for mounting the plurality of package type IC components on the top and bottom surfaces of the printed circuit board so that the IC packages directly oppose each other. This method is provided at low cost because conventional mounting process is used without making large changes.

To achieve the foregoing objects, in accordance with a first aspect of the invention, a first example is provided of a card type semiconductor device having a CPU, an input/output device and a memory, which are mounted on circuit boards. The circuit boards are a main board and a sub-board electrically connected to the main board. The memory comprises a memory element mounted on the sub-board.

A memory capacity can be easily changed to adapt to changes in the end product into which the card type semiconductor computer is incorporated and to changes in the operating conditions of the end product by changing only the sub-board containing the memory without changing the components on the main board.

A large number of card type semiconductor devices containing different memory capacities can be easily and quickly manufactured at a low cost by using the same general-purpose main board. Thus, as technology advances, memory capacity can be easily changed using the same main board.

Additionally, the design of the CPU and the memory can be easily changed adapting to changing performance requirements and to special purpose applications. Consequently, the adaptability of the card type semiconductor device can be provided at a low cost.

In a second example of the card type semiconductor computer, the CPU is mounted on the main board. And only memory components are mounted on the sub-board. Thus, only the memory capacity of the card type semiconductor computer can be easily changed by replacing the sub-board with another package.

In a third example, the CPU is mounted on the sub-board. Thus, the performance and the memory capacity of the card type semiconductor computer can be easily changed by designing the main board to be commonly usable for multiple purposes and adaptation can be achieved by changing the sub-board.

In a fourth example, the main board and the sub-board are connected with each other through a low cost flexible printed circuit.

In a fifth example, the main board and the sub-board are detachably connected with each other through a pair of connectors. A large number of connection terminals can be provided at a narrow pitch by using a connector. The card type semiconductor computer can easily adapt to an increase in number of the interconnecting lines by increasing the connection terminals of the connector.

In a sixth example of the card type semiconductor device, in addition to the features of the fourth example, the sub-board is placed to face the main circuit board by bending the flexible printed circuit with a large curvature.

A seventh example fixes the main board and the sub-board together to form a single unit. Thus, the main board and sub-board are fixed to prevent the relative positions of the boards from changing due to vibration, for example. Thus, electrical connections are secured by removing stress from the flexible printed circuit and the connector.

In an eighth example, in addition to the features of the first example, the card type semiconductor device is provided with a card-shaped thin housing for enclosing the main board and the sub-board. At least a surface of the housing comprises a metal plate that protrudes outwardly. The outward protrusion is achieved by a drawing process. The metal plate provides rigidity and prevents deformation of the card-shaped thin housing.

Mechanical loads imposed upon the flexible printed circuit and the connector is reduced by integrally fixing the main board and the sub-board to face each other. Thus, the durability against an external forces due to vibration and shock is improved. In addition, the card type semiconductor device is reduced in size and thickness. Furthermore, a side surface portion of the card-shaped housing for enclosing the device encloses the card type semiconductor device by a metal plate. Further, fixing the main board and the sub-board to face each other further reduces the thickness of the card type semiconductor device.

In a ninth example, a connector is provided having a large number of terminals for connection to an external apparatus. Two of the terminals are a dot clock signal terminal and a grounding terminal adjacent to the dot clock signal terminal. The dot clock signal connects to an external liquid crystal display (LCD). The grounding terminal stabilizes the dot clock signal. Consequently, a display of an image in the LCD is stabilized.

In a tenth example, a connector is provided having a plurality of rows of a large number of terminals for connecting to an external apparatus. A first set of three terminals of one of the plurality rows are an R-signal terminal, a G-signal terminal and a B-signal terminal. These first set of three terminals are connected to an external CRT. Furthermore, a second set of three terminals of another of the plurality rows are an R-return-signal terminal, a G-return-signal terminal and a B-return-signal terminal which correspond to the R-signal terminal, the G-signal terminal and the B-terminal, respectively. The first and second sets of three terminals face each other along two separate rows of the connector. The first set of three terminals transmit analog signals output to a CRT while the second set of three terminals transmit return signals corresponding to the analog output signals. Thus, the effect of external noises on the first and second sets of three terminals is lowered by using closely adjacent terminals. Consequently, a display of the CRT is stabilized.

In an eleventh example, a connector for connecting to an external apparatus is provided. The connector is divided along its length into horizontally asymmetric portions. Thus, the connector prevents erroneous connection with a corresponding mating connector.

In a twelfth example a second sub-board is mounted on a surface of the main board having an analog circuit. A unified power supply terminal of the second sub-board is connected to the main board. The influence of noise on the power supply potential generated by digital circuits is reduced. Further, space on the main board is saved by forming the analog circuit portion of the card type semiconductor device on the sub-board separated from the digital circuits and by using the unified power supply terminal.

In accordance with a second aspect of the invention, there is provided a card type semiconductor device which comprises a plurality of electronic components mounted on circuit boards. The circuit boards are a main board and a plurality of sub-boards. At least two of the plurality of sub-boards are mounted on both surfaces of the main board so that two sub-boards are mounted on opposite surfaces of the main board and have positions on the main board so that the two sub-boards are symmetric with respect to the main board.

Thus, card type semiconductor devices which have the same size and shape but different functions can be mounted on sub-boards providing a plurality of sub-boards that perform different functions. One or more of the sub-boards can be mounted on the main board to personalize a card type semiconductor device for a specific application thus reducing cost and time. If warpage of the sub-board occurs resulting in the main board being deformed, two sub-boards are mounted on the main board symmetric with respect to the main circuit board to prevent sub-board warpage and deformation of the main board.

A third aspect of the invention provides a method for manufacturing the card type semiconductor device. The method comprises mounting electronic components on a sub-board, placing the sub-board at a predetermined position on a main board, detachably attaching the sub-board to the main board and connecting the sub-board to the main board.

Thus, even if the sub-board is warped, the sub-board is securely positioned and connected to the main board. Moreover, the method produces increased yields of the card type semiconductor device and the method requires only minor changes to the conventional manufacturing process.

A first example of a fourth aspect of the invention provides a first IC package and a second IC package mounted on a first surface and a second surface of a printed circuit board, respectively. The card type semiconductor device comprises a first connection portion for connecting a lead of the first IC package with a first land formed on the first surface and a second connection portion for connecting a lead of the second IC package with a second land formed on the second surface. The first surface is opposite to the second surface. Moreover, the first IC package and the second IC package are placed so that the second connection portion directly opposes the first connection portion.

Thus, the horizontal cross-sections of the connection portions of the IC packages mounted on the opposite surfaces of the main board overlaps in a plan view of the card type semiconductor device. Mounting the IC packages as described above reduces the required wiring area. Moreover, the area of each of the opposite surfaces of the printed circuit board can be effectively utilized. The wiring lengths between the IC packages is also reduced.

In a second example, the second connection portion of a side of the second IC package is directly opposing the first connection portion of a side of the first IC package. Thus, the wiring area of the printed circuit board between the first and second connection portions is reduced.

In a third example, the second connection portion of all four sides of the second IC package is directly opposing the first connection portion provided correspondingly to a corresponding one of all the four sides of the first IC package. Thus, the wiring area of the circuit board is considerably reduced.

In a fourth example of the card type semiconductor device according to the fourth aspect of the present invention, the first and second IC packages comprise IC chips which operate in conjunction with one another. Thus, for example, a power supply lead and a grounding lead of each IC package are placed close to the corresponding leads of other IC package. The wiring length between the IC packages is shortened and a through-hole is used in common between the IC packages.

In a fifth example, the first IC package comprises a CPU and the second IC package comprises an I/O system operating with the CPU. The number of signal and address lines in common between the IC packages is large. Thus, the number of through-holes is considerably reduced by using common through-holes in between the IC packages.

This arrangement facilitates high density packaging and high speed operation. Moreover, the stability and reliability of the card type semiconductor device is improved.

In a sixth example, the first IC package or the second IC package is a tape carrier package (TCP). Thus, wires can be formed underneath the TCP package and through-holes can be bored in the area beneath the TCP to connect the TCP on one side of the printed circuit board with connections on the opposite side of the printed circuit board.

In a first example of a fifth aspect of the invention, the card type semiconductor computer comprises a first IC package and a second IC package. The first IC package and the second IC package are mounted on opposite surfaces of a printed circuit board the second IC package directly opposes the first IC package. The first IC package and the second IC package are connected to the opposite surfaces of the printed circuit board through a die bonding.

The first IC package and the second IC package are connected to each other through thermal via holes bored through the printed circuit board so that heat is able to be transferred between the first IC package and the second IC package.

Thus, a part of the heat generated by the first and second IC packages is transferred through the thermal via-holes and dissipated. Consequently, the heat dispersion area can be substantially increased without using expensive heat dissipating means and cooling devices. This heat dissipating structure is suitable for the miniaturization of the card type semiconductor device and is not costly.

In a second example, leads of the first IC package and leads of the second IC package are mounted on the opposite sides of the printed circuit board and are coated with a thermally conductive resin. Heat generated by the IC package is transferred through the leads and dissipated from the thermally conductive resin.

In a first example of a sixth aspect a method for manufacturing the card type semiconductor device is provided. The card type semiconductor device comprises a plurality of IC packages mounted on first and second surfaces of a printed circuit board. The method comprises placing a first IC package on the first surface of the printed circuit board. The first IC package on the first surface of the printed circuit board is connected to a land formed on the first surface by bonding a lead of the first IC package to the land. Turning the printed circuit board upside down, the printed circuit board is placed on a pedestal so that a bonding portion between the lead of the first IC package and the land formed on the first surface is supported by the pedestal. Then, place a second IC package on the second surface of the printed circuit board so that a bonding portion between a lead of the second IC package and a land formed on the second surface is directly opposing the bonding portion between the lead of the first IC package and the land formed on the first surface. Bond the lead of the second IC package to the land formed on the second surface by pressing the lead of the second IC package and the land formed on the second surface by using a pressing device.

Thus, the second IC package is connected to the second surface of the printed circuit board by using the pedestal for supporting the printed circuit board and the pressing device for pressing the connection portions.

In a second example, the lead of the second IC package and the land formed on the second surface are heated while pressed by the pressing device. The lead of the second IC package and the land formed on the second surface are bonded by solder.

In a third example, the lead of the second IC package and the land formed on the second surface are heated while pressed by the pressing device. The lead of the second IC package and the land formed on the second surface are bonded by thermocompression.

In a fourth example, the lead of the second IC package and the land formed on the second surface are heated while pressed by the pressing device. The lead of the second IC package and the land formed on the second surface are bonded by an isotropic electrically conductive film.

In a fifth example, the lead of the second IC package and the land formed on the second surface are irradiated with light while pressed by the pressing device. The lead of the second IC package and the land formed on the second surface are bonded by a photo-curing resin.

Thus, the second IC package can be easily connected to the second surface of the printed circuit board so that the first and second packages are mounted on opposite sides of the printed circuit board and directly opposed to each other. The first and second packages can be mounted by conventional methods such as soldering, thermocompression, isotropic electrically conductive film and photo-curing resin.

BRIEF DESCRIPTION OF THE DRAWINGS

The invention will be described in detail with reference to the following drawings, wherein:

FIG. 17 is a diagram of the pin assignment of a first portion of a card type semiconductor device connector;

FIG. 18 is a diagram of the pin assignment of a first part of a second portion of the card type semiconductor device connector;

FIG. 19 is a diagram of the pin assignment of a second part of the second portion of the card type semiconductor device connector;

FIG. 20 is a diagram of the pin assignment of a third portion of the card type semiconductor device connector.

DETAILED DESCRIPTION OF THE PREFERRED EMBODIMENTS

Figure 1:
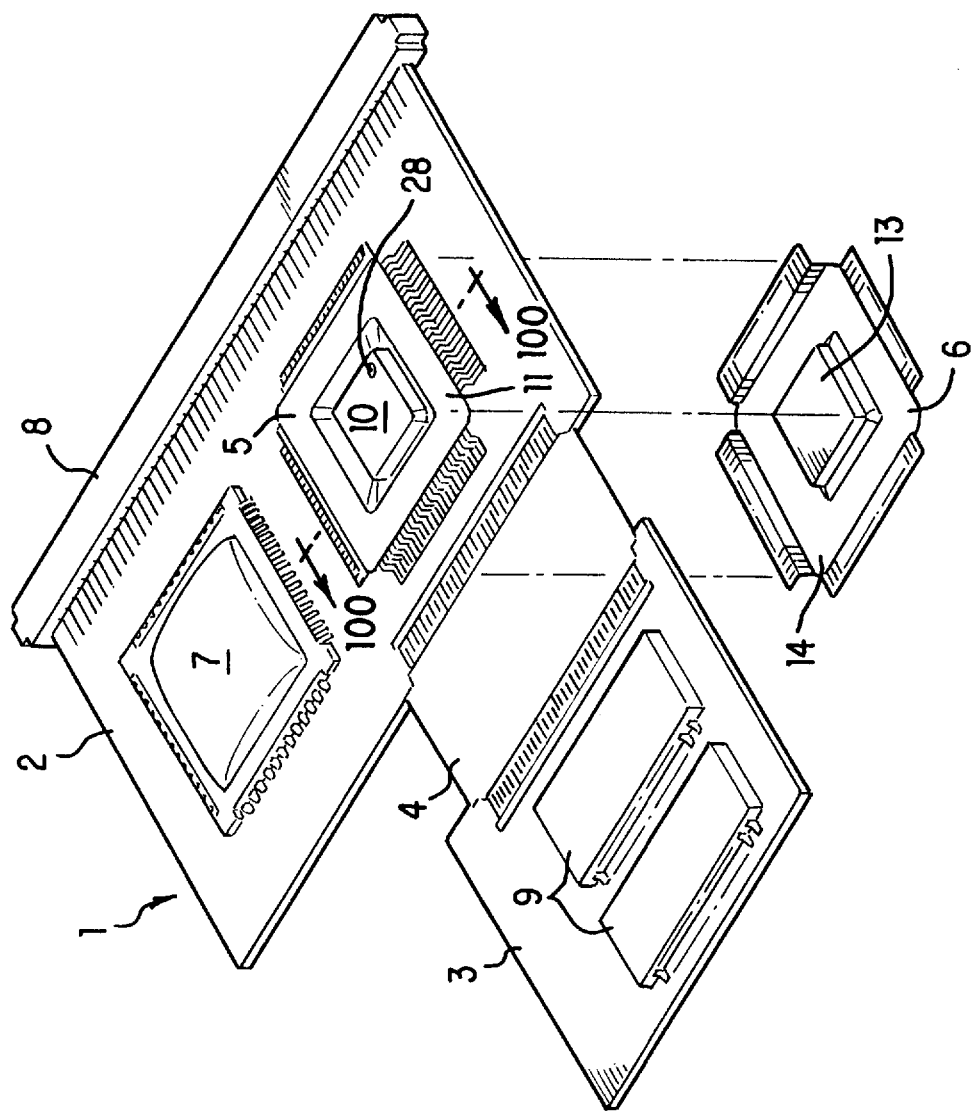
FIG. 1 is a perspective view of a card type semiconductor device for use in a card type computer.

FIG. 1 shows a first embodiment of the invention. A card type semiconductor device 1 is used as a card-type small computer. The card type semiconductor device 1 comprises a main board 2 and a first sub-board 3. The main board 2 and the first sub-board 3 comprise one of a ceramic material and a glass epoxy material. The main board 2 has a multilayered structure for double-sided mounting. The first sub-board 3 is smaller than the main board 2 and is electrically connected to the main board 2 through a flexible printed circuit (FPC) 4 soldered to a top surface of the main board 2. A first TCP 5 is connected to the top surface of the main board 2. A second TCP 6 is connected to a bottom surface of the main board 2 at a position directly opposing the position of the first TCP 5 so that the positions of the TCPs 5 and 6 are symmetric with respect to the main board 2. The land portions of the leads attached to each of the four sides of the TCP 6 is placed directly opposing a corresponding land portion of the four sides of the TCP 5.

A second sub-board 7 and a third sub-board (not shown) are printed circuit boards for mounting electronic components and connected to the top and bottom surfaces of the main board 2 respectively, so that these boards are beside the TCPs 5 and 6, respectively. The positions of these thin printed circuit boards are symmetric with respect to the main board 2. The second sub-board 7 is placed directly opposing the third sub-board.

The second sub-board 7 and the third sub-board are equipped with a plurality of different packages, having electronic components corresponding to the different functions of the card type semiconductor device 1. The electronic components can be designed for different functions thus generating uniquely tailored card type semiconductor device 1. Prepackaged second sub-board 7 and third sub-board can be available so that a wide range of functions can be assembled by selecting available second sub-board 7 and third sub-board. Thus design and cost can be dramatically reduced. Even if extremely specialized functions are required, new designs are limited to the second sub-board 7 or the third sub-board which can be quickly designed since the design burden of higher level packaging is already completed.

Furthermore, the main board 2 is equipped with electronic components (not shown) which comprise a computer system. Additionally, a connector 8 connects the card type semiconductor device 1 to an external apparatus as shown in FIG. 1.

Two random access memories (RAMs) 9 are mounted onto the first sub-board 3 to form a main memory of the card type semiconductor device 1. Thus, the FPC 4 is placed close to the first TCP 5 of the main board 2. For this embodiment, each RAM 9 is 4 mega bits providing a total main memory of 8 mega bits.

The memory capacity of the main memory can be easily altered by changing the capacity of the RAM 9 or the number of the RAMs 9. Adapting new main memory configurations requires minimal cost and time since the modules of the main board 2 are not disturbed. Only the first sub-board 3 is replaced by another package.

Figure 2:
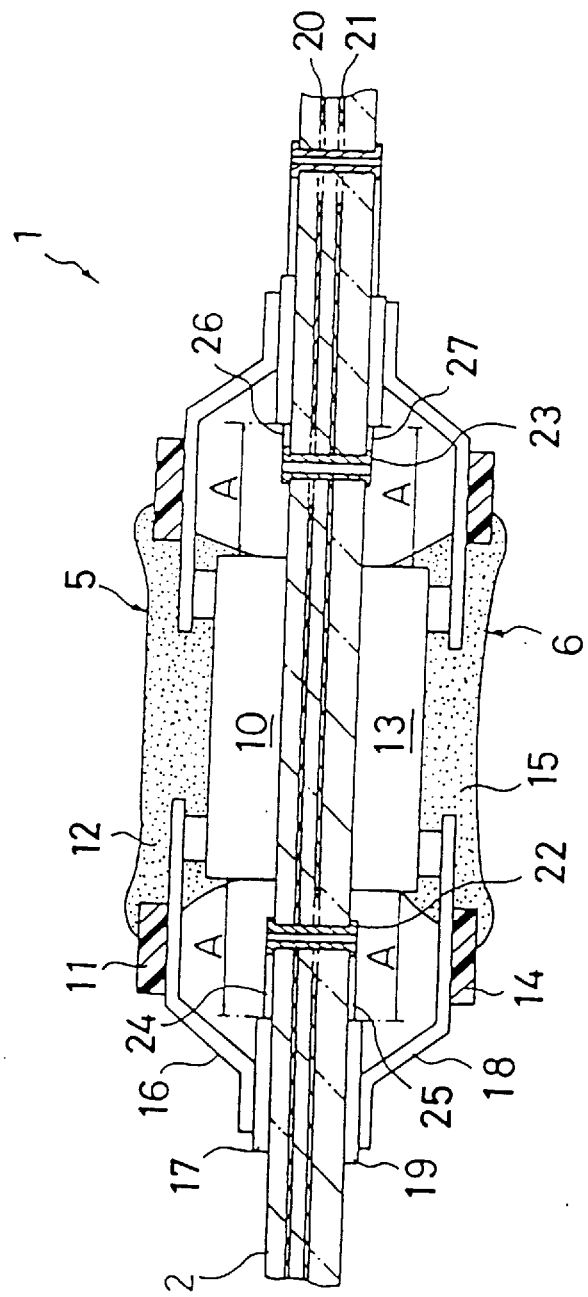
FIG. 2 is a sectional view of a printed circuit board of the card type semiconductor device taken on line 100—100 of FIG. 1.

FIG. 2 shows the first TCP 5 as a nearly square thin IC package having a surface coated with a protective resin 12. A CPU 10 is incorporated into the central opening of a tape carrier 11. The second TCP 6 is also a thin IC package of nearly identical shape and size with the first TCP 5. The second TCP 6 contains an I/O sub-system chip 13 and is disposed into the central opening of a tape carrier 14. The surface of the second TCP 6 is also coated with a protective resin 15.

FIG. 2 shows that a large number of outer leads 16 are formed along the four sides of the first TCP 5 extending outwardly. The first TCP 5 is electrically connected to lands 17 formed on the first surface of the main board 2 by soldering the outer leads 16 to the lands 17.

Similarly, the second TCP 6 is electrically connected to lands 19 formed on the second surface of the main board 2 by soldering the outer leads 16 formed along the four sides of the TCP 6 to the lands 19.

For this embodiment, the lands 19 provided on the bottom surface of the main board 2 is substantially opposing the lands 17 provided on the top surface. The TCP 5 and TCP 6 are mounted substantially on the respective lands 17 and 19 by attaching the connection portions of the other leads 16 and 18 to the corresponding lands 17 and 19, respectively. The CPU 10 and the I/O device 13 are located generally in the central portions between the lands 17 and 19 leaving regions A within the space allocated to the TCPs 5 and 6 free from any other components. Thus, interconnecting lines are located in region A inwardly from the lands 17 and 19 providing connections between the top and bottom surfaces of the main board 2 by using through-holes.

For this embodiment, the main board 2 is a multilayered structure consisting of six layers. A power supply line 20, a grounding line 21, and signal lines are provided in the internal layers of the main board 2. The power supply line 20 is connected to the power supply terminals of the CPU 10 and the I/O sub-system chip 13 through the interconnecting lines 24 and 25 extending inwardly from the connection portions and through the common through-hole 22. The grounding terminals of the CPU 10 and the I/O sub-system chip 13 are connected to the common grounding line 21 through the interconnecting lines 26 and 27 extending inwardly from the connection portions and through the common through-hole 23. Other terminals of both TCPs are appropriately connected to predetermined signal lines through-holes and via holes (not shown).

Aligning the TCPs 5 and 6 to be substantially opposing each other on the top and bottom surfaces of the main board 2 provides the region for through-holes and interconnection lines. This advantage is lost if the TCPs 5 and 6 are not aligned. If the TCPs 5 and 6 are not aligned, then through holes and interconnecting lines must be given dedicated surface area on the top and bottom surfaces of the main board 2. Thus, aligning the TCPs 5 and 6 to oppose each other provides for high density packaging and further provides for greater freedom in interconnecting pattern designs.

Further, the CPU 10 and the I/O system chip 13 closely operate together. Aligning the CPU 10 and the I/O system chip 13 directly opposite to each other allows the CPU 10 and the I/O system chip 13 to be connected to the power supply and grounding lines at approximately the same physical locations and provides both devices with substantially the same power supply potential. Thus the stability of operations is enhanced.

Moreover, the close physical proximity of the CPU 10 and I/O system chip 13 allows short wiring lengths of the interconnecting lines between these two devices. Shorter interconnecting lines permits higher operating speeds because line inductance and impedance is reduced. Further, capacitance between adjacent interconnecting lines is also reduced thus reducing noise induced onto the interconnecting lines.

In this embodiment, the CPU 10 is an "80386SL" microprocessor and the I/O system chip is an "82360SL". Both the "80386SL" and "82360SL" are manufactured by Intel Corporation. Both of the chips "80386SL" and "82360SL" are placed so that the first pins indicated by reference numeral 28 are located at the lower left corner when viewed from a position above the connector 8. Placing the chips in this position allows most of the pins that are connected together between the CPU 10 and the I/O system chip 13 to be directly opposing each other on the opposite surfaces of the main board 2. Thus, the number of through-holes is reduced which reduces the surface area consumed by the through-holes by about 20%. The stability and reliability of the device operation is further improved by the resulting short wiring lengths.

Figure 3:
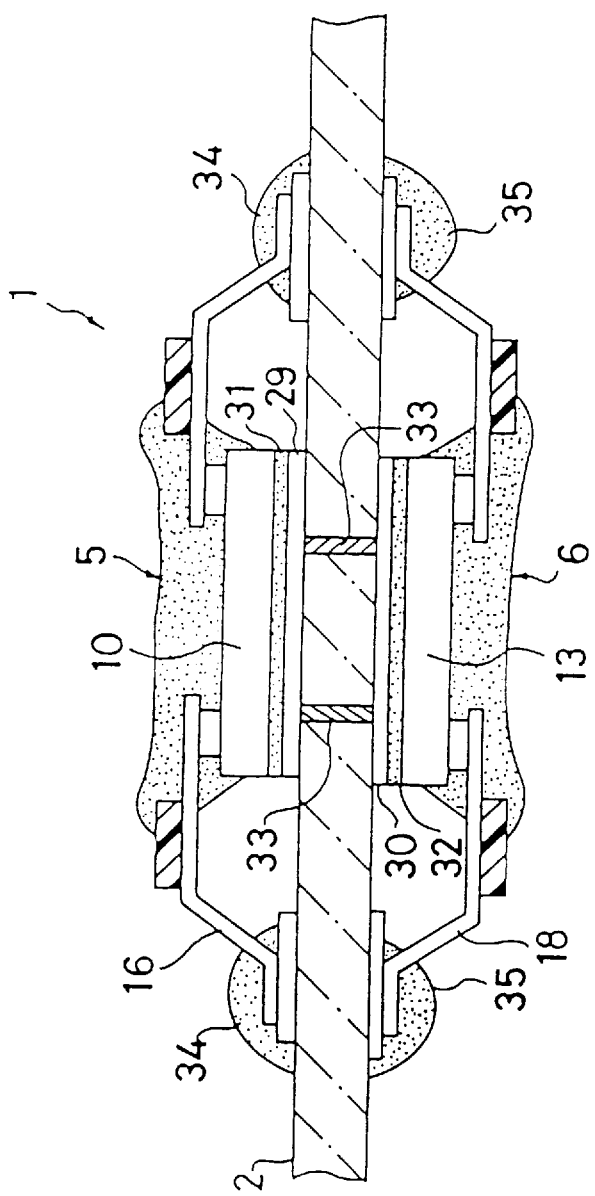
FIG. 3 is a sectional view of a modification of the printed circuit board of the card type semiconductor device taken on line 100—100 of FIG. 1.

FIG. 3 shows a modification of the first embodiment of the invention. Die pads 29 and 30 have dimensions corresponding to that of the CPU 10 and the I/O sub-system chip 13, respectively. The die pads 29 and 30 are placed at predetermined locations on the top and bottom surfaces of the main board 2, respectively. The CPU 10 and the I/O system chip 13 are connected to the die pads 29 and 30 by applying thermally conductive resins 31 and 32 such as silver paste onto the entire bottom surfaces of the device. A plurality of thermal via holes 33 are bored through the main board 2. The die pads 29 and 30 are thermally connected with each other through the thermal via holes 33 to transfer heat between the die pads 29 and 30.

When in operation, the CPU 10 generates more heat than generated by the I/O sub-system chip 13. Therefore, a first part of the heat generated by the CPU 10 is transferred to the die pad 30 through the thermally conductive resin layer 31, the die pad 29 and the thermal via hole 33 and dissipated from the I/O sub-system chip 13. Further, a second part of heat is transferred through the thermal via-hole 33 to the main board 2 and dissipated by the main board 2.

Insulating resins 34 and 35 protect each of the connection portion between each of the outer leads 16 and the corresponding land 17 of the first TCP 5 and the connection portion between each of the outer leads 18 and the corresponding land 19 of the second TCP 6. The insulating resins 34 and 35 also conduct heat. Therefore, a third part of the heat generated by the CPU 10 is dissipated from the insulating resin 34 through the outer lead 16 of the first TCP 5 and also dissipated from the insulating resin 35 through the outer lead 18 of the second TCP 6. Thus, highly exothermic devices can be mounted on the board at high density without using expensive heat dissipating devices to increase the heat dissipation area.

Figure 4A:
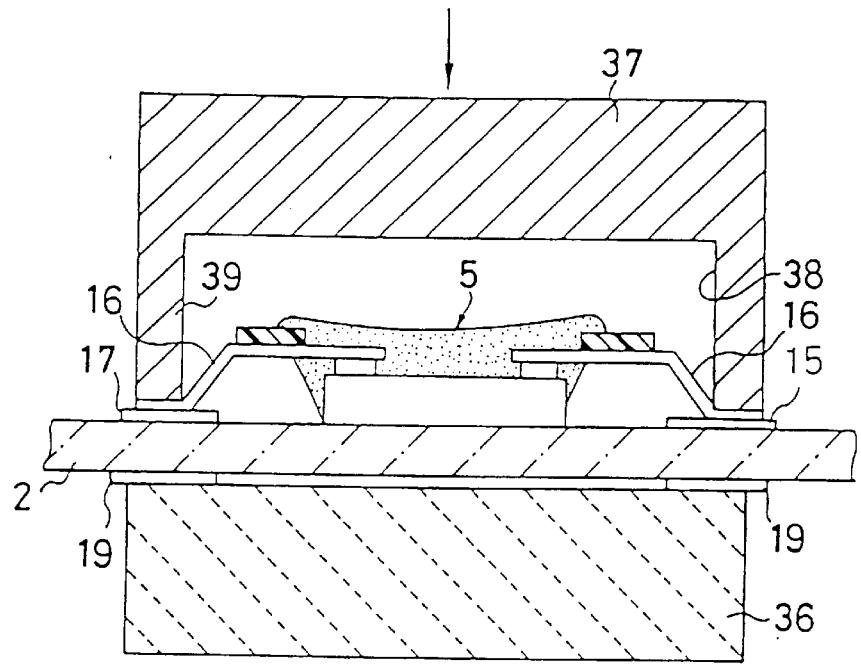
FIGS. 4A and 4B are sectional diagrams of a mounting process of the first embodiment of the invention.
Figure 4B:
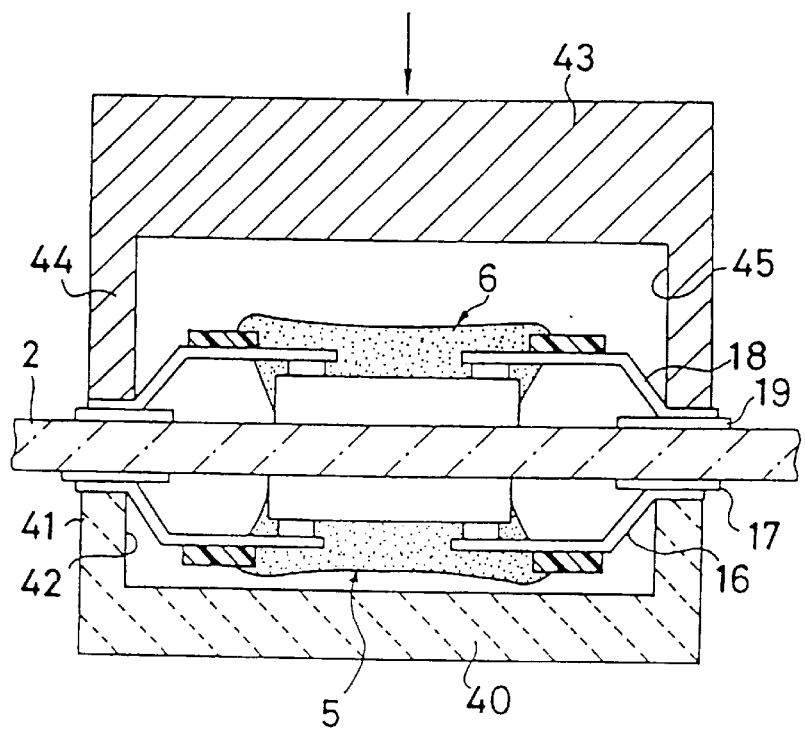

FIGS. 4A and 4B show a process for mounting the two TCPs 5 and 6 on the top and bottom surfaces of the main board 2. FIG. 4A shows a method for connecting the first TCP 5 to the top surface of the main board 2. The lands 17 are first coated with a layer of solder. The outer leads 16 of each of the four sides of the first TCP 5 are adjusted to the corresponding lands 17 and are placed at a predetermined position on the main board 2. The main board 2 is put on a first pedestal 36. The pedestal 36 has a flat top surface to provide support beneath the lands 17.

Next, a bonding tool 37 is lowered to above the first TCP 5. A pressing portion 39 of the bonding tools 37 has a generally rectangular-shaped cross-section corresponding to the shape of the connection portions between the outer leads 16 and the lands 17. This cross-section shape is formed by providing a rectangular recess portion 38 in the central part of the bottom portion of the bonding tool 37. The pressing portion 39 pushes all the tips of the outer leads 16 against the top surfaces of the lands 17 simultaneously. At the same time, the connection portions between the outer leads 16 and the lands 17 are heated thus soldering the outer leads 16 and the lands 7 together at the connection portions.

The first TCP 5 protrudes from the top surface of the main board 2. However, almost all but the top portions of the outer leads 16 are enclosed in the recess portion 38. Therefore, the protruded TCP 5 does not interfere with this pressing step. After the connection portions cool, the bonding tool 37 is lifted and separated from the outer leads 16. Each of the outer leads 16 is soldered to the corresponding lands 17.

FIG. 4B shows the main board 2 turned upside down from the previous position prepared for mounting the second TCP 6 onto the main board 2. Each of the outer leads 18 of the second TCP is positioned to above a corresponding land 19. The lands 19 are coated with a solder layer. The main board 2 is put on a second pedestal 40 which has a periphery supporting portion 41. The cross-section of the periphery supporting portion 41 is a generally rectangular shape similar to the bottom surface of the bonding tool 37. Thus, the second pedestal 40 supports the main board 2 at the connection portions between the outer leads 16 and the lands 17. Parts of the first TCP 5 other than such connection portions are enclosed in a rectangular recess portion 42 formed in the central part of the top portion of the second pedestal 40.

Next, a bonding tool 43 is lowered to above the second TCP 6. The bonding tool 43 has a similar shape as the bonding tool 37. The bonding tool 43 has a pressing portion 44 having a generally rectangular horizontal cross-section and a central recess portion 45 in the bottom portion of the bonding tool 43. If the positions, shapes and sizes of the connection portions corresponding to the second TCP 6 are the same as those of the connection portions corresponding to the first TCP 5, the bonding tool 37 may be used as the bonding tool 43.

The tips of all of the outer leads 18 are connected at one time to the top surfaces of the lands 19 by pushing the tips of the outer leads 18 against the top surfaces of the corresponding lands 17 and simultaneously heating the connection portions between the outer leads 18 and the lands 19. Thus the main board 2 is supported and pressed between a periphery supporting portion 41 of the pedestal 40 and a corresponding pressing portion 44 of the bonding tool 43. The two TCPs 5 and 6 are mounted at positions directly opposing each other on the top and bottom surfaces of the main board 2, respectively, without being hindered by the TCP 5 or 6 previously connected to the main board 2.

In the above embodiment, the two TCPs 5 and 6 have substantially the same size. However, for opposing TCPs which have different sizes, the smaller TCP is connected to one of the top and bottom surfaces of the main board 2 first and then the larger TCP is connected to the other surface of the main board 2. This sequence allows a larger pedestal to be used to support the larger TCP without interferences from the previously mounted smaller TCP.

Figure 5:
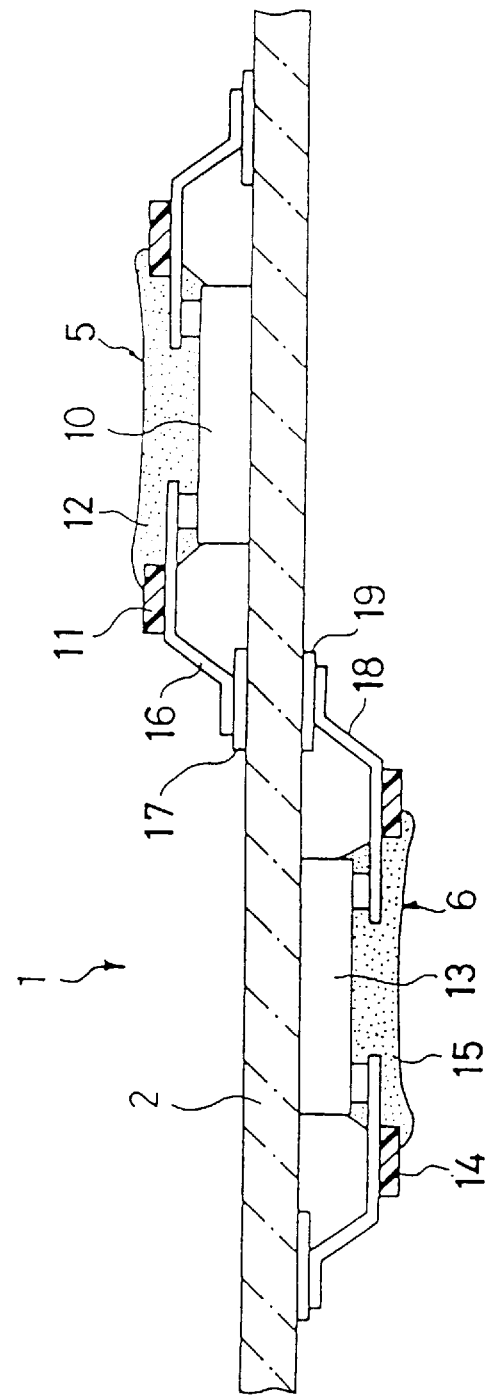
FIG. 5 is a sectional view of a second example of the printed circuit board of the invention.

FIG. 5 shows a second embodiment. The first TCP 5 and the second TCP 6 are mounted on the top and bottom surfaces of the main board 2, respectively. Instead of having all the corresponding connection portions, tips of the outer leads 16 and 18 and the leads 17 and 19 of all four sides of each of the TCPs 5 and 6 oppose each other, only the connection portions, tips of the outer leads 16 and 17 and the lands 17 and 19 of one of the four sides of each of the TCPs 5 and 6 oppose each other. Thus, when the layout of the components on the main board 2 prevents the TCPs 5 and 6 from being totally aligned to directly oppose each other on the top and bottom surfaces of the main board 2, at least a part of the connection portions of opposing TCPs can be so aligned permitting a high density package to be achieved. A common through-hole can be bored in the main board 2 close to the outer leads 16 of the first TCP 5 and the opposing outer leads 18 of the second TCP 6. Thus, the wiring lengths between the first and second TCPs 5 and 6 can be decreased increasing the operating speed of the computer system. Noise is also reduced by the short wire lengths resulting in operational stability and reliability of the computer system.

Figure 6A:
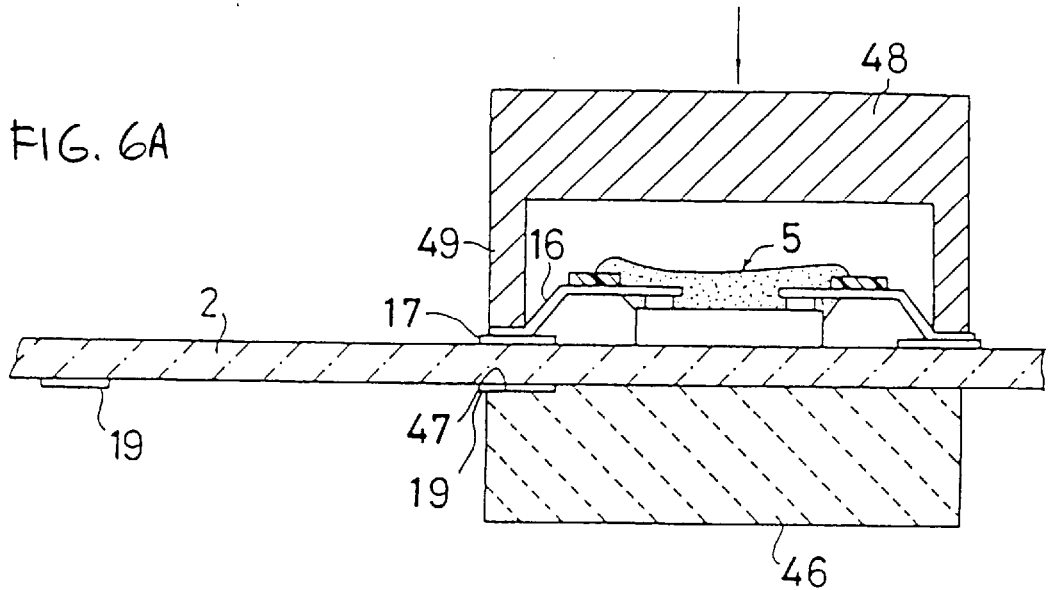
FIGS. 6A and 6B are sectional diagrams of a mounting process of the second example of the printed circuit board of the invention.
Figure 6B:
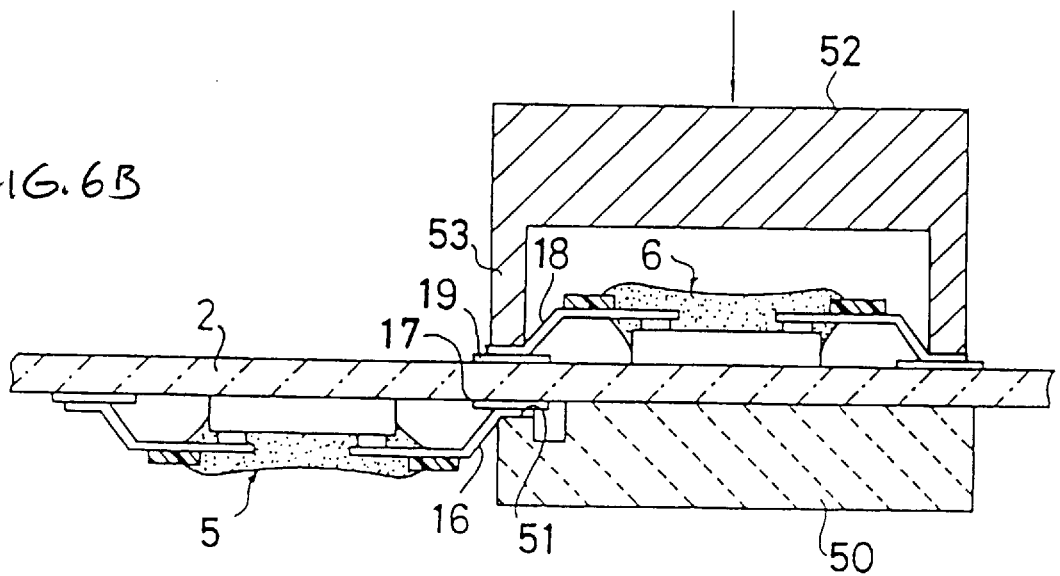

FIGS. 6A and 6B show the process for mounting the two TCPs 5 and 6 onto the main board 2. FIG. 6a shows that the first TCP 5 is placed on the surface of the main board 2 by adjusting the outer lead 16 of each of the four sides of the first TCP 5 to the corresponding land 17. This main board 2 is put on a first pedestal 46, which has a flat top surface with a stair portion 47 corresponding to the land 19 which directly opposes the corresponding land 17. The first pedestal 46 effectively supports the main board 2 including the area containing the lands 19.

Next, a bonding tool 48 is lowered to above the first TCP 5. A pressing portion 49 having a generally rectangularly-shaped horizontal cross-section is formed in the bottom portion of the bonding tool 48. The tips of the outer leads 16 of the four sides of the TCP are pushed by the pressing portion 49 against connection portions and the corresponding lands 17 while heat is applied to the connection portions, the tips of the outer leads 16 and the corresponding lands 17. The first TCP 5 is soldered to the surface of the main board 2 by a solder layer previously coated on the lands 17. The bonding tool 48 is lifted after the connection portions is cooled.

FIG. 6b shows that the second TCP 6 is mounted on the bottom side of the main board 2 by turning the main board 2 upside down and positioning and adjusting each of the outer leads 18 of the four sides of the second TCP to align with the corresponding lands 19. The main board 2 is put on a second pedestal 50. The second pedestal 50 has a top surface having a stair portion 51 corresponding to the connection portion of the first TCP 5 but otherwise the top surface is flat. The stair portion 51 supports the main board 2 directly under the lands 19.

Next, a bonding tool 52 is lowered to above the second TCP 6. The bonding tool 52 has a pressing portion 53 which has a horizontal cross-section having a generally rectangular shape. The tips of the outer leads 18 are pushed by a pressing portion 53 formed in the bottom portion of the tool 52 against the lands 19 while heat is applied to the connection portions, the tips of the outerleads 18 and the lands 19. The second TCP 6 is soldered onto the back surface of the main board 2 by a solder layer previously coated onto the lands 19.

Figure 7:
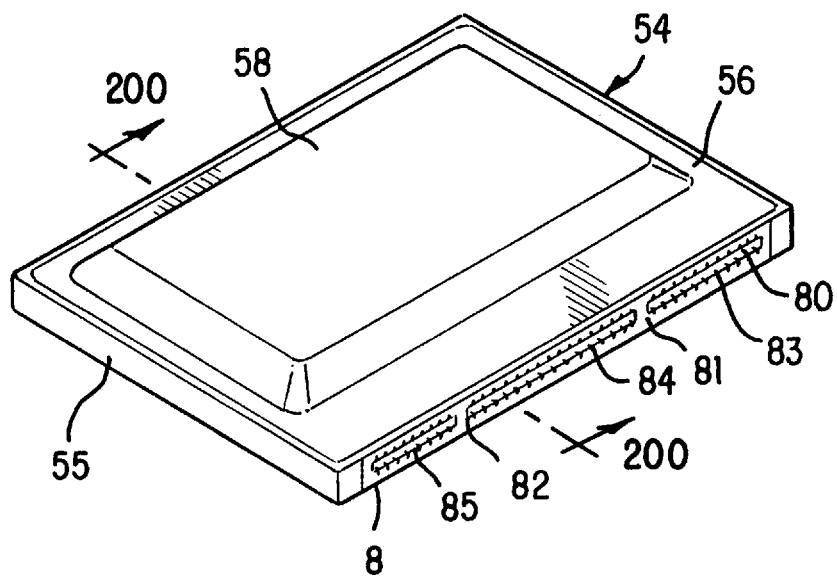
FIG. 7 is a perspective view of a card type housing of the first embodiment of the invention.
Figure 8:
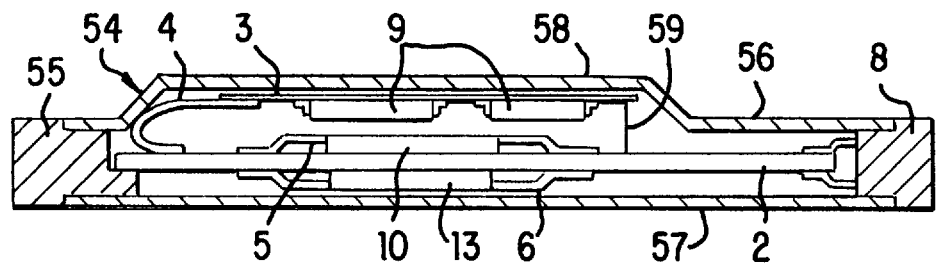
FIG. 8 is a sectional view of a structure for connecting a main board with a sub-board, taken on line 200—200 of FIG. 7.

FIG. 7 shows a card-type computer in which the card type semiconductor device 1 is enclosed in a card-shaped housing 54 similar to an IC card. The housing 54 includes a frame body 55, a metallic top-surface panel 56, a flat bottom-surface panel 57 and a protrusion portion 58 of the top-surface panel 56 protruding from the housing 54 by a constant height, as illustrated in FIGS. 7 and 8. The frame body 55 comprises zinc or aluminum die-cast material shaped substantially like a right bracket "]".

Generally, the card-shaped housing is a monolithic resin case. However, both of panels 56 and 57 are connected to the frame body 55 by using screws or adhesives. The frame body 55, the top-surface panel 56 and the bottom-surface panel 57 are electrically connected and provide an electrostatic shield for the main board 2 and the first sub-board 3. Further, the housing 54 precludes radiation noises of the board from escaping and external noises from affecting the electronic components of the card type semiconductor device 1.

FIG. 8 shows that the card type semiconductor device 1 is enclosed in the housing 54 and that the first sub-board 3 is faced toward main board 2 by bending the FPC 4. The main board 2 is fixed to the frame body 55. The main board 2 and the first sub-board 3 are spaced apart at a constant interval by a spacer member 59 and fixed into a single unit. The spacer member 59 may comprise a block made of an insulating material having some flexibility, such as a polycarbonate resin. The spacer member 59 can be attached to the main board 2 and the sub-board 3, preferably close to the centers of the main board 2 and the sub-board 3, by an adhesive, for example.

The thickness of the entire card type semiconductor device 1 can be reduced by using the above fixing method. Moreover, the main board 2 and the sub-board 3 are relieved of excessive stress by the flexibility of the spacer member 59. Thus the boards are protected from vibration and shock.

While in the housing 54, the top surface of the main board 2 on which the first TCP 5 is mounted faces the surface of the first sub-board 3 on which the RAM 9 is mounted. Since the FPC 4 is connected to the top surface of the main board 2, through-holes in the main board 2 are not needed to connect the FPC 4 to the TCP 5. Consequently, less surface area of the main board 2 is consumed by through-holes facilitating further miniaturization of the main board 2 and providing greater freedom in circuit design and wiring of the main board 2.

Figure 9:
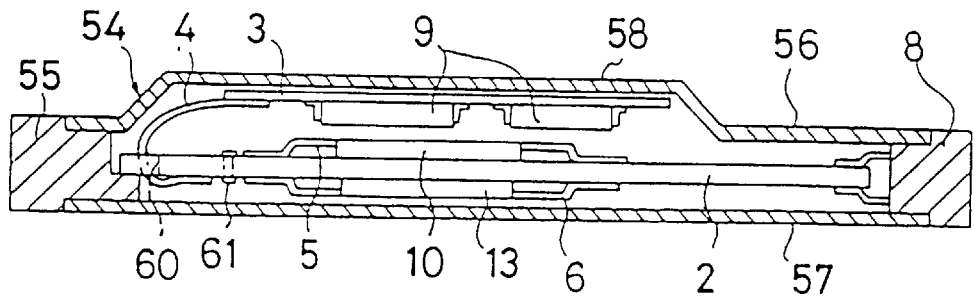
FIG. 9 is a sectional view of a flexible printed circuit connected to a bottom surface of the main board with the sub-board components facing the main board.

FIG. 9 shows that the FPC 4 is connected to the bottom surface of the main board 2 facing away from the first sub-board 3. A notch portion 60 is formed in a side edge portion of the main board 2 and the FPC 4 is connected to the bottom surface of the main board 2 through the notch portion 60. A through-hole 61 provides for connecting the CPU 10 with the FPC 4.

Feeding the FPC 4 through the notch portion 60 allows the FPC 4 to be bent at a larger curvature than when connecting the FPC 4 to the top surface of the main board 2 as shown in FIG. 8. Consequently, a stress on the connection portion between the FPC 4 and the main board 2 is reduced preventing breakage failures in the connection portion of the FPC 4.

An embodiment different from the embodiment shown in FIG. 8 is illustrated by a further placement configuration of the first TCP 5 and the second TCP 6. The TCP 5 is mounted on the bottom surface of the main board 2 while the FPC 4 is connected to the top surface of the main board 2. Thus it is necessary to bore a through-hole in the main board 2. The CPU 10 is placed adjacent to the bottom-surface panel 57. Therefore, a part of the large quantity of heat generated by the CPU 10 is dissipated through the bottom-surface panel restraining the internal temperature rise of the card type semiconductor device 1.

An embodiment different from the embodiment shown in FIG. 9 is illustrated by another placement configuration. The CPU 10 and the FPC 4 are mounted on the bottom surface of the main board 2. Thus, no through holes are required. The curvature of the FPC 4 is large, because the FPC 4 goes through the notch portion 60 to connect to the bottom side of the main board 2. Moreover, the TCP 5 faces the bottom-surface panel 57 thus taking advantage of the additional heat dissipation provided by the bottom surface panel 57.

Figure 10:
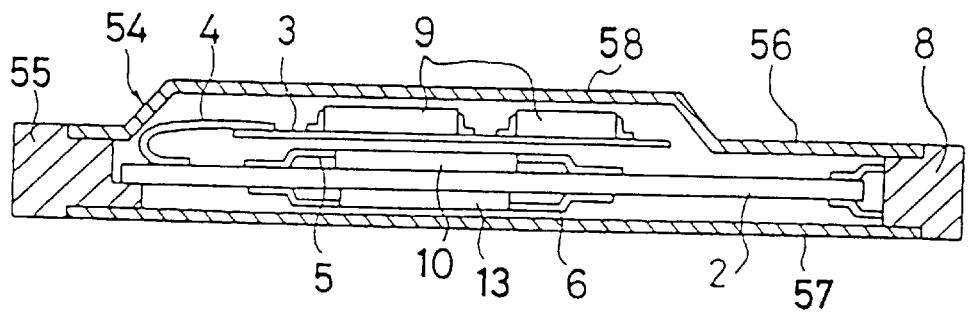
FIG. 10 is a sectional view of the flexible printed circuit connected to a top surface of the main board with the sub-board components facing away from the main board.
Figure 11:
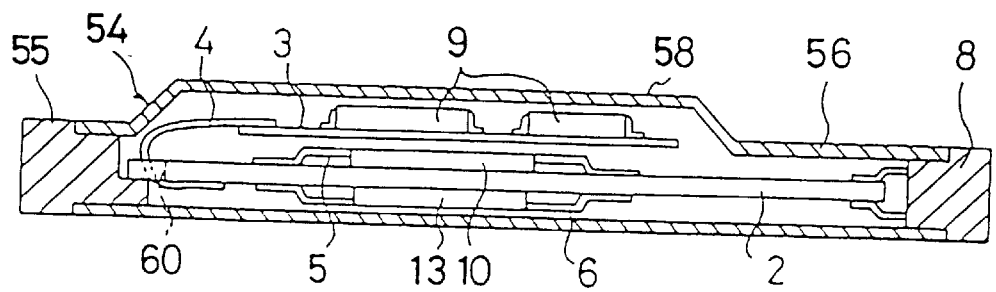
FIG. 11 is a sectional view of the flexible printed circuit connected to bottom surface of the main board with the sub-board components facing away from the main board.

The placement configuration shown in FIGS. 10 and 11 requires a greater thickness of the housing 54 because the RAM 9 is placed on the surface of the first sub-board 3 facing the top-surface panel 56. However, the top surface panel 56 dissipates heat from the RAM 9 and thus restrains temperature rise of the IC card.

The top-surface panel 56 of the housing 54 comprises a metal plate from which the outwardly protruding portion 58 is formed. A firm material, such as a stainless steel having a Vickers hardness ranging from about 150 to 250 and a thickness of about 0.2 mm, may be used as the metal plate. This metal plate limits the thickness of the entire housing 54 to a predetermined value and prevents deformation by external forces as shown in FIG. 12.

When the housing 54 is handled manually, the external force often acts upon the central portion of the top-surface panel 56. However, even if the top-surface panel 56 is dented, the dent has minimal effect on the electronic components because the spacer member 59 is centrally placed on the main board 2 and the first sub-board 3.

Figure 12:
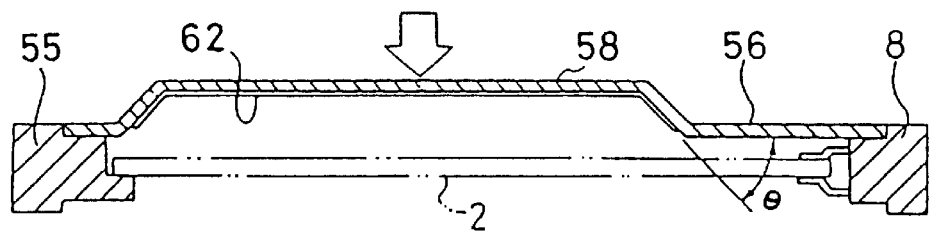
FIG. 12 is a sectional diagram of the structure of a card type housing.

FIG. 12 shows the rising angle Θ of the protruding portion 59. This angle Θ is about 45 to 90 degrees, because the portion 59 is so rigid that pressures exerted by a finger can be sustained without damage and space is provided to enclose the first sub-board 3 even if the size of the first sub-board 3 is increased due to an increase in memory capacity.

The top-surface panel 56 is flat except for the rising part of the protruding portion 58. Thus, the protruding portion 58 is easily positioned onto the frame body 55 during assembly manufacturing productivity is improved.

The strength of the connector 8 for attaching or detaching the card-type computer can be increased by spacing the protruding portion 58 and the connector 8 out by a certain distance. Moreover, a conventional resist material 62 is applied to substantially the entire inner surface of the protruding portion 58 including the rising portion to prevent the inner surface of the protruding portion 58 from directly contacting the first sub-board 3.

Figure 13A:
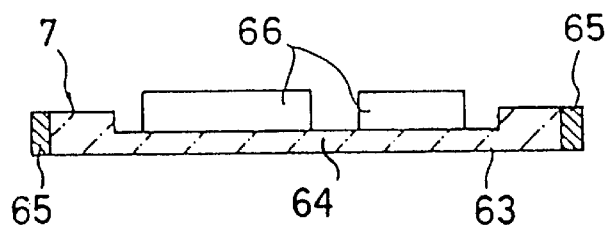
FIGS. 13A to 13C are sectional diagrams of a process for manufacturing a second sub-board.
Figure 13B:
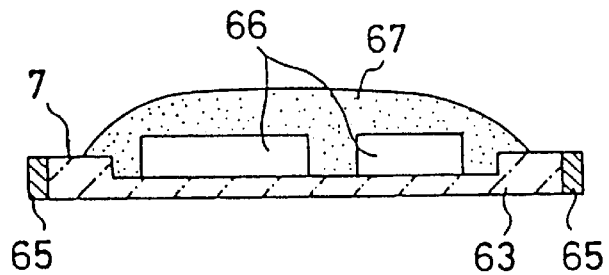
Figure 13C:
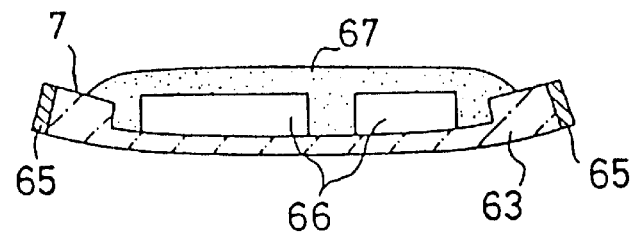

FIGS. 13A–13C show a second sub-board 7 and a process for manufacturing the second sub-board 7. The second-board 7 comprises a four-layer wiring board 63 which has a thickness of about 1 mm. The thickness of the central region 64 of the second sub-board is reduced by almost about half for mounting electronic components and to realize a thin board. A thinner wiring board having a thickness of about 0.3 mm may be used as the wiring board 63. A large number of terminals 65 are provided on the peripheral edge of the wiring board 63 for electrical connections to the main board 2.

FIG. 13A show a plurality of electronic components 66, such as a logic ICs and a microcomputer, are placed at predetermined positions in the central region 64. The electric components 66 are connected to the wiring board 63 by conventional methods such as wire bonding or soldering. Next, a thermosetting protective resin 67 is applied to cover the electronic components 66 and the entire central region 64 as shown in FIG. 13B. Then, heat is applied to set the protective resin 67.

Unfortunately, when the protective resin 67 is cooled, an upward warpage occurs in the peripheral region of the board 63, as illustrated in FIG. 13C. This warpage is caused by the difference in the thermal expansion coefficient between the central region 64 and the peripheral region of the board 63. The thin central portion 64 of the wiring board 63 is not rigid enough to prevent the warpage.

If the warped second sub-board 7 is placed precisely at a predetermined position on the main board 2, any slight movement of the main board 2 easily causes the second sub-board 7 to move from the predetermined position. Thus, it is very difficult to accurately and securely connect the second sub-board 7 to the main board 2.

Moreover, when the sub-board 7 is connected to the main board 2 at the predetermined position, the main board 2 may be deformed by the second sub-board warpage.

FIGS. 14A to 14E show a method for mounting the warped second sub-board 7 at the predetermined position on the main board 2 without deforming the main board 2.

Figure 14A:
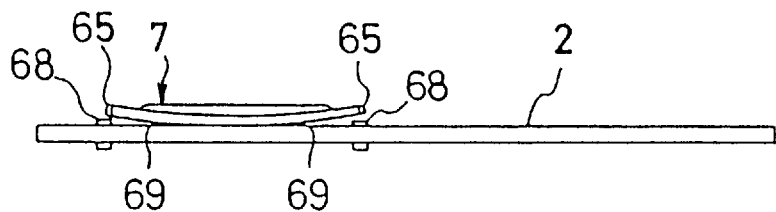
FIGS. 14A to 14E are diagrams of a process for connecting the second and third boards to both the top and bottom surfaces of the main board.

A large number of pads 68 are formed on the surface of the main board 2 for connecting to the terminals 65 of the second sub-board 7. FIG. 14A shows that the bottom surface of the second sub-board 7 is tentatively glued onto the top surface of the main board 2 with an adhesive 69 while the second sub-board 7 is being positioned. It is preferable that the adhesive 69 is applied to at least two places on the bottom surface of the sub-board 7. The adhesive 7 may be applied only to a single place unless the sub-board 7 shifts from the predetermined position. If the second sub-board 7 shifts from the predetermined position, the sub-board 7 can be easily repositioned by simply repeating the positioning process. Once positioned, the sub-board 7 is not easily moved by shifting the main board 2.

Next, the terminals 65 of the second sub-board 7 is reflow soldered to the corresponding pads 68 of the main board 2 by heating the terminals 65 and pads 68 to about 230 degrees centigrade in a period of about 10 seconds by utilizing infrared radiation or hot air.

Figure 14B:
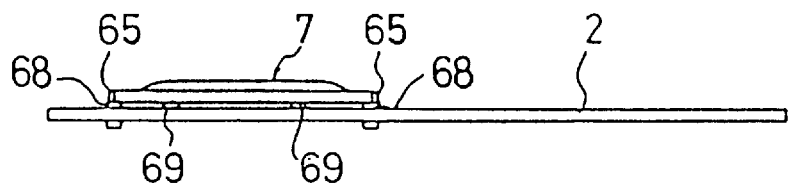
Figure 14C:
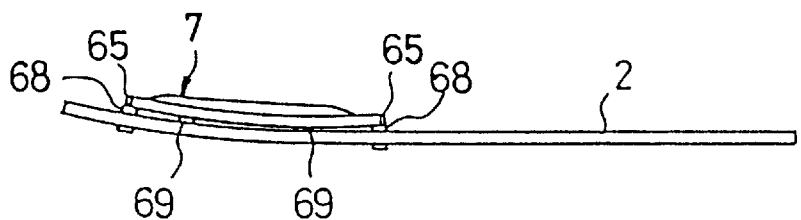

FIG. 14B show the second sub-board warpage disappears due to the thermal expansion of the protective resin 67 during heating for the reflow soldering. However, when the board is cooled again, the main board 2 is warped by the warping force of the second sub-board 7, as illustrated in FIG. 14C.

Figure 14D:
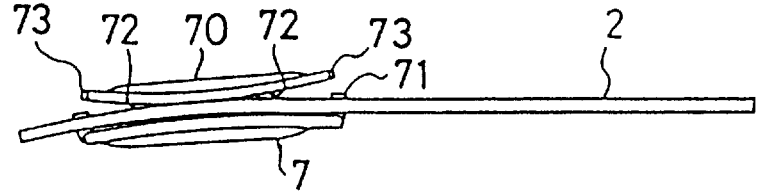

The main board 2 is turned upside down, as illustrated in FIG. 14D and a third sub-board 70 is mounted on the bottom surface of the main board 2. The third sub-board 70 may be equipped with analog circuit parts such as a floppy disk drive, an A/D converter and a PLL. The third sub-board 70 is substantially same size and shape as the second sub-board 7.

Figure 14E:
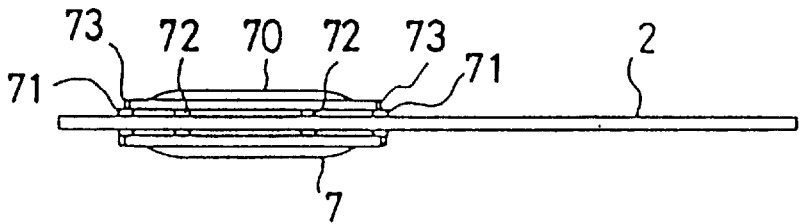

A large number of pads 71 are preliminarily formed on the bottom surface of the main board 2 for mounting the third sub-board 70. The pads 71 are positioned on the bottom surface of the main board 2 so that the mounting positions of the sub-boards 7 and 70 are nearly symmetrical with respect to the main board 2. The third sub-board 70 is reflow soldered onto the back surface of the main board 2 by the same process used to mount the second sub-board 7 to the main board 2. Thus, the terminals 73 provided on the peripheral edge portion of the third sub-board 70 is connected to corresponding pads 71, as illustrated in FIG. 14E. As described above, the warpage of the second and third sub-boards 7 and 70 disappears when the second and third sub-boards 7 and 70 are heated for reflow soldering. Therefore, as long as the position of the third sub-board 70 is precisely determined, the reflow soldering is easily achieved.

The warping forces of the second and third sub-boards 7 and 70 act in opposite directions, so that the main board 2 is held in a straight and flat state after the second and third sub-boards 7 and 70 cool down. When the second and third sub-boards 7 and 70 are of different sizes, the main board 2 can be restrained from warpage by mounting the second and third sub-boards 7 and 70 in nearly symmetric positions with respect to the main board 2.

One of the terminals 73 is a unified power supply terminal of the third sub-board 70. The unified power supply terminal is connected to a power supply line of the main board 2. The unified power supply terminal of the third sub-board 70 provide power supply line isolation for the circuits mounted on the third sub-board 70 from power supply line noise generated by other digital circuits such as the RAM 9 mounted on the first sub-board 3.

This power supply line noise isolation is especially important for analog circuits. The invention forms analog circuit parts on a sub-board having a unified power supply terminal which reduces noise in the power supply lines and stabilizes the analog circuits. Additionally, power supply line noises can be further reduced by adding a filter to a power supply circuit of the third sub-board 70. Further, the unified power terminals saves space on the main board 2 leading to reduction in size and cost of the card type semiconductor device.

Figure 15A:
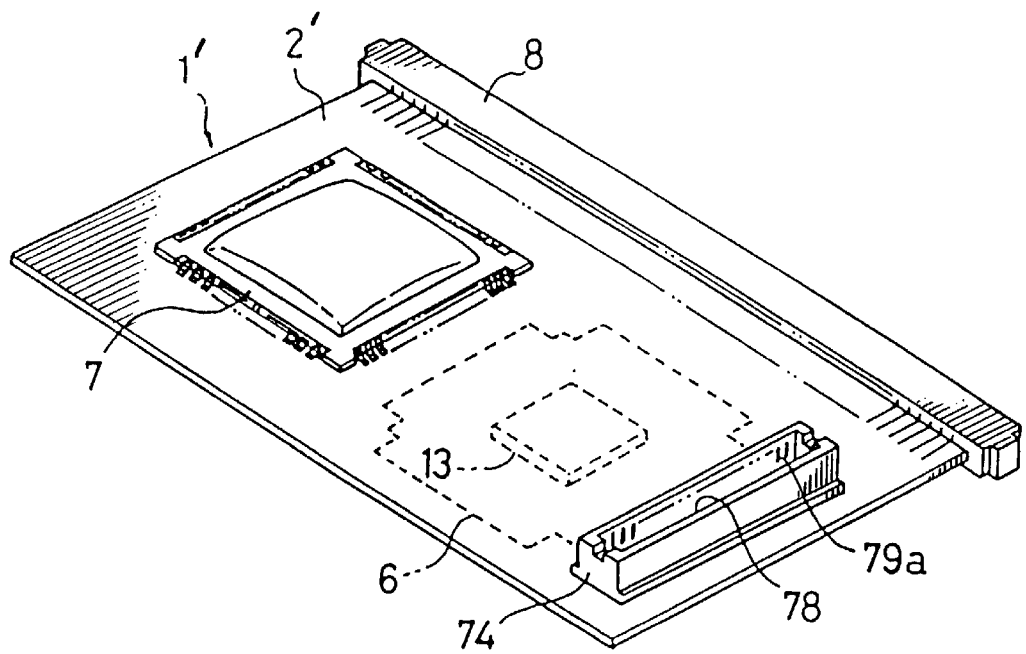
FIGS. 15A and 15B are perspective diagrams of the main board and the first sub-board of the second embodiment of the card type semiconductor device.
Figure 15B:
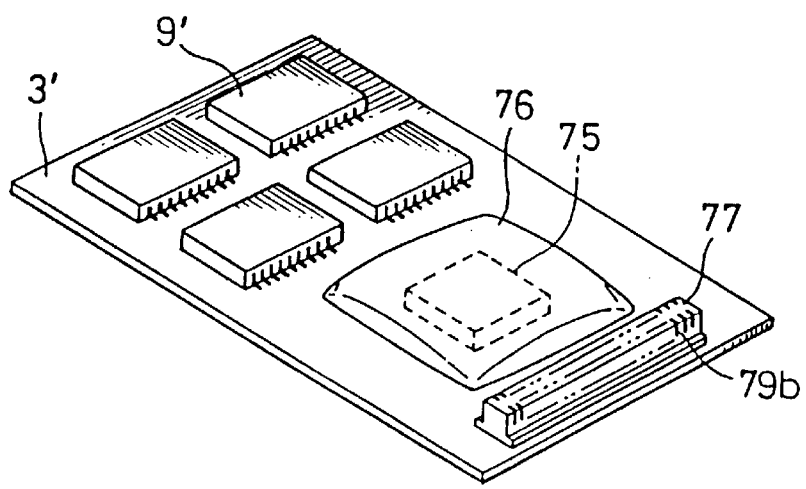

FIGS. 15A and 15B show a second embodiment of the invention. The card type semiconductor device 1' comprises a main board 2', shown in FIG. 15A, and a first sub-board 3', shown in FIG. 15B. the main board 2' and the first sub-board 3' are detachably connected to each other by a pair of connectors instead of the FCP 4 of the first embodiment. The main board 2' and the first sub-board 3' are both electrically and mechanically connected and disconnected through the pair of connectors. The main board 2' includes an elongated female connector 74 mounted on the top surface of the main board 2'. A bare chip CPU 75 is directly mounted on a surface of the first sub-board 3' by a Chip on Board (COB) method and is coated with a protective resin 76.

Four RAMs 9' are mounted on the same surface as the CPU 75 is mounted, as illustrated in FIG. 15B. The RAMs 9' from the main memory of the semiconductor, device 1'. An elongated male connector 77, corresponding to the female connector 74 of the main board 2' is mounted on the first sub-board 3'. The CPU 75 and the RAM 9' are interconnected through a data bus provided on the first sub-board 3'. As a result, the wiring length between the CPU 75 and the RAM 9' is reduced when compared with the corresponding wire lengths of the first embodiment. For this embodiment, a 33 MHZ "80486" microprocessor is employed as the CPU 75. The "80486" microprocessor is manufactured by the Intel Corporation of the U.S.A. The shorter wiring lengths permit higher operational speeds thus permitting the speed of the 33 MHZ "80484" to be fully exploited.

The female connector 74 is placed on the top surface of the main board 2' as shown in FIG. 15A. An elongated slot-like connection portion 78 complements the male connector 77 and is provided on the top surface of the main board 2'. The connection portion 78 comprises two rows of terminals 79a. For this embodiment, 100-pin connection terminals are provided having a narrow pitch of about 0.5 mm.

The male connector 77 is placed in close proximity to the CPU 75 along one of the side edges of the first sub-board 3' as shown in FIG. 15B. For this embodiment two rows of 100-pin connection terminals 79b corresponding to the two rows of the connection terminals 79a of the female connector 74 are provided having a narrow pitch of about 0.5 mm.

Figure 16:
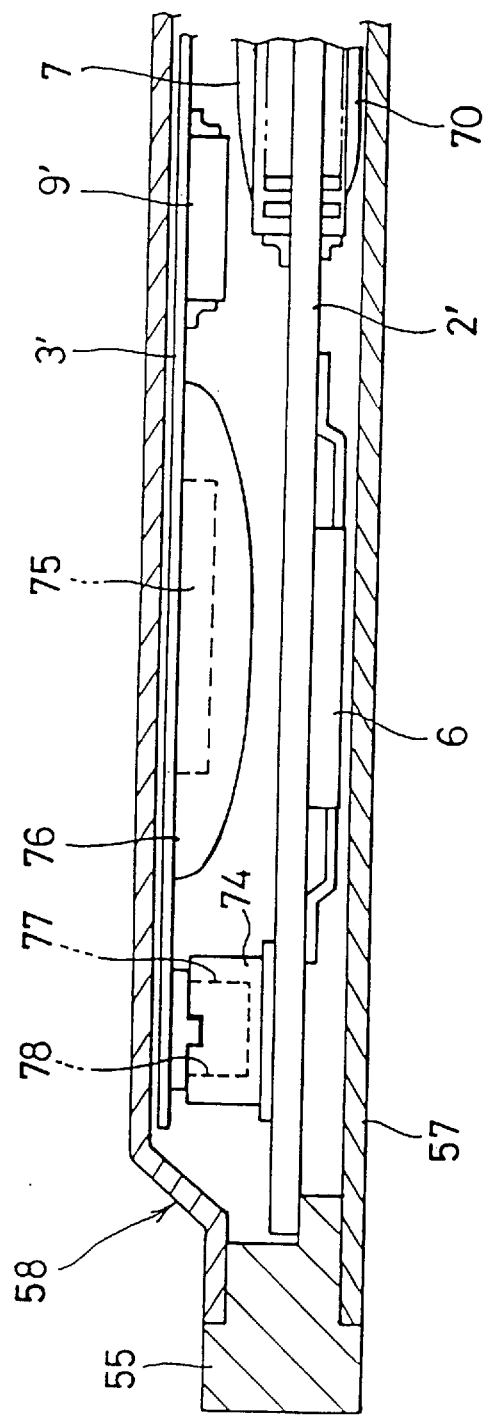
FIG. 16 is a partially enlarged sectional view of the main board and a first sub-board of the second embodiment.
Figure 21:
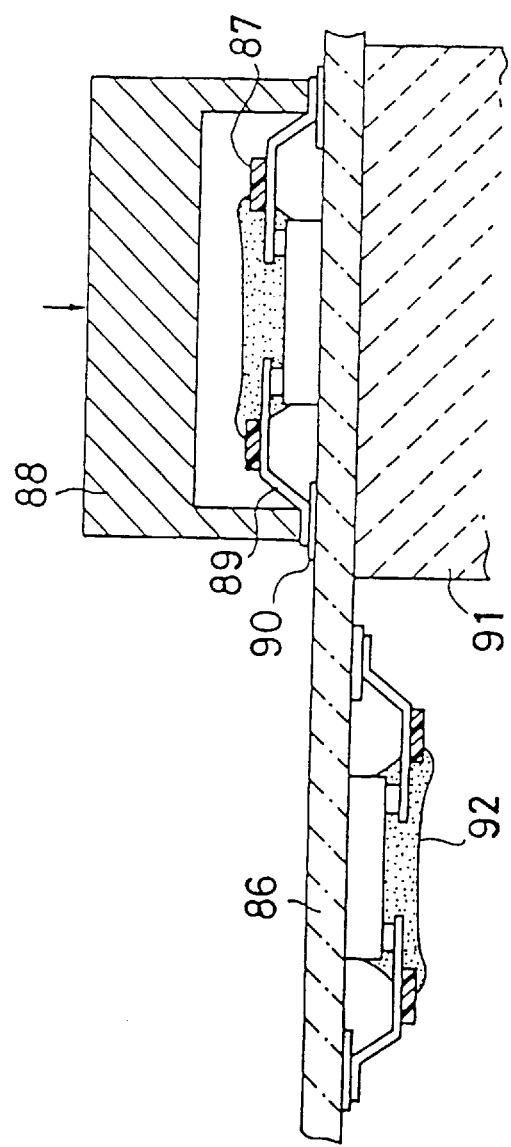
FIG. 21 is a sectional diagram of a double-sided board mounting process for a conventional card type semiconductor device.

The pitch of terminals 79a and 79b can be narrower in comparison with the FPC 4 of the first embodiment. Even when the number of signal lines is increased to 32 or more, for 32 bit buses, a connector of similar type can easily accommodate the required number of signal lines. FIG. 16 shows that the main board 2' and the first sub-board 3' are integrally and extractably coupled to each other by fitting the male connector 77 into the connection portion 78 of the female connector. When the first sub-board 3' is connected to the main board 2', the CPU 75 faces the main board 2'. The CPU 75 occupies the corresponding space that the TCP 5 of the first embodiment occupied. Thus, the thickness of the semiconductor device is reduced.

Further, the connection between the main board 2' and the first sub-board 3' may be between the main board 2' and the first sub-board 3' secured by keeping a constant interval by using a spacer member (not shown) that is similar to the spacer members 59 used in the first embodiment. However, the main board 2' and the first sub-board 3' can be mechanically fixed without the spacer member by using only connectors. Of course, connectors of various types may be used as the connectors 74 and 77. Additionally, each of the connectors 74 and 77 may be placed at other positions than described above.

FIG. 7 shows that the connector 8 has an upper and lower rows of pins. For this embodiment, each row has 118 pins so that the connector 8 can accommodate up to 236 signals. The signal names that are assigned to the 236 pins for this embodiment are shown in FIGS. 17–20. In this embodiment, an opening 80 of the connector 8 is partitioned by two reinforcing ribs 81 and 82 into three opening portions 83–85. The ribs 81 and 82 are placed at horizontally asymmetric positions along the longitudinal direction of the connector 8 so that the three opening portions 83 to 85 have different lengths from one another. Corresponding to the three openings 83–85, the pins of the connector 8 are also partitioned into a first region, a second region and a third region. The signals assigned to the pins of the first-third regions are shown in FIGS. 17, 18–19 and 20, respectively.

The asymmetric positions of the ribs 81 and 82 uniquely determine the direction that the connector 8 is connected to a corresponding mating connector thus preventing the connector 8 from erroneously connected to the mating connector. The connector 8 is shown as a female connector in FIG. 7, but the connector 8 can be a male connector having slot portions in place of the ribs. Further, connectors having more than two rows of pins are also possible to accommodate for a greater number of signals as required.

FIG. 17 shows two parallel upper and lower rows of 28 pins numbered from 1 to 28 and 119 to 146. These pins connect the computer primarily to external peripheral devices such as a liquid crystal display (LCD), a cathode ray tube (CRT), a keyboard, a mouse and a floppy disk drive unit. FIGS. 18 and 19 show two rows of 55 pins numbered from 29 to 83 and 147 to 201. These pins are associated with a serial interface, a power management system and an AT bus (or expansion bus). FIG. 20 shows two rows of 35 pins numbered from 84 to 118 and 202 to 236. These pins provide connections to, for example, a serial interface, a parallel interface, a hard disk drive unit and a power management system. The output voltage levels of the signals assigned to all the pins are 3.3 V or 5 V.

FIG. 17 shows a specific example of signals that may be assigned to the pins of the first region. A flat panel data shift clock signal (FPDOTCLK) for an LCD interface is assigned to pin 121 which is adjacent to a ground line connected to pin 120. The FPDOTCLK signal is a clock signal for shifting display data. The FPDOTCLK signal is stabilized by assigning the ground line to the adjacent pin which thereby, in turn, stabilizes the LCD displaying operation.

A blue signal (BLUE), a green signal (GREEN) and a red signal (RED) of an RGB signal for a CRT are assigned to pins 15–17, respectively. Return signals (BRTN, GRTN, PRTN) corresponding to the blue, green and red signals assigned to the pins 15–17 are assigned to pins 133–135, respectively. As shown in FIG. 17, pins 15–17 face line 133–135 which place the signals on the pins to be in close physical proximity. This placement substantially cancels the effect of external noises by putting the pins for outputting analog color signals for a CRT (namely, the red, green and blue signals) as close as possible to those of pins for receiving the corresponding return signals. Thus, a display on the CRT is insensitive to the influence of the external noises. Consequently, the quality of the display on the CRT is improved maintaining a high quality of the CRT display.

Although the preferred embodiments of the invention have been described above, it should be understood that the invention is not limited thereto and that other modifications will be apparent to those skilled in the art without departing from the spirit of the invention. For example, the main board 2 and the first sub-board 3 of the first embodiment can be connected with each other through the connector of the second embodiment. Conversely, the main board 2' and the first sub-board 3' of the second embodiment can be connected with each other through the FPC 4 of the first embodiment. Further, various known methods other than soldering, for example, alloying the lead with the lands through thermocompression, using a sheet-like anisotropic electrically conductive film and using a photo-curing insulating resin may be employed as methods for connecting the TCPs with the circuit board. Moreover, the invention can be applied to mount other package types of electronic components having leads, such as the QFP. The scope of the invention, therefore, is determined solely by the appended claims.

Further, although in the preferred embodiments the IC packages are placed directly opposing each other on the opposite surfaces of the main board, the IC packages can be generally opposing each other without affecting this invention. Of course, it is appreciated that the lands and the bonding portion between the leads of the first and second IC packages can also be generally opposing each other instead of directly opposing each other.

What is claimed is:

1. A card type semiconductor device, comprising:
   a main circuit board having a first side and a second side, electronic components being mounted on the main circuit board on both the first and second sides, the electronic components on the first side of the main circuit board opposing the electronic components on the second side of the main circuit board;
   a sub-circuit-board coupled to the main circuit board mounted with electronic components wherein the main circuit board and the sub-circuit-board are detachably electrically coupled through a pair of electrical connectors so that the main circuit board faces the sub-circuit-board; and
   a card-shaped thin housing for enclosing the main circuit board and the sub-circuit board, wherein the electronic components on the first side of the main circuit board are thermally connected to the electronic components on the second side of the main circuit board through thermal via-holes bored through the main circuit board so that heat is transferred between the electronic components.

2. The card type semiconductor device of claim 1, wherein the main circuit board and the sub-circuit-board are fixed together into one unit by a spacer device so that the main circuit faces the sub-circuit-board.

3. The card type semiconductor device of claim 1, wherein at least a surface of the card-shaped thin housing is made of a metal plate protruding outwardly.

4. The card type semiconductor device of claim 1, further comprising a connector having a large number of terminals for connecting to an external apparatus.

5. The card type semiconductor device of claim 4, wherein two of the terminals are a dot clock signal terminal connected to an external liquid crystal display and a grounding terminal adjacent to the dot clock signal terminal.

6. The card type semiconductor device of claim 4, wherein the large number of terminals are arranged into a plurality of rows, three terminals of one of the plurality of rows being an R-signal terminal, a G-signal terminal and a B-signal terminal and three terminals of an adjacent row of the plurality of rows being an R-return-signal terminal, a G-return-signal terminal and a B-return-signal terminal corresponding to the R-signal terminal, the G-signal terminal and the B-terminal, respectively, the R-return-signal terminal, the G-return-signal terminal and the B-return-signal terminal facing the R-signal terminal, the G-signal terminal and the B-signal terminal, respectively, and all six terminals being connected to an external CRT.

7. The card type semiconductor device of claim 4, wherein the large number of terminals are arranged into a plurality of rows, and the plurality of rows are divided into horizontally asymmetric portions by a plurality of ribs.

8. The card type semiconductor device of claim 7, wherein the plurality of ribs prevent the connector from being erroneously connected to a mating connector.

9. The card type semiconductor device of claim 1, further comprising a second sub-circuit-board mounted on one of the first and second surfaces of the main circuit board, wherein an analog circuit is mounted on the second sub-circuit-board and a power supply terminal of the second sub-circuit-board is connected to a power supply line of the main circuit board.

10. The card type semiconductor device of claim 1, further comprising:
   a plurality of other sub-circuit-boards, a plurality of other electronic components mounted on the plurality of other sub-circuit-boards, wherein at least a first and second ones of the plurality of other sub-circuit-boards are mounted on the first and second sides of the main circuit board, respectively, the first and second ones of the plurality of other sub-circuit-boards being mounted opposing each other so that mounting positions of the first and second ones of the plurality of other sub-circuit-boards are symmetric with respect to the main circuit board, wherein the card-shaped thin housing also encloses the plurality of other sub-circuit-boards.

11. The card type semiconductor device of claim 1, further comprising:
   a first IC package mounted on a first surface of the main circuit board and a second IC package mounted on a second surface of the main circuit board;
   a first plurality of connection portions for connecting a plurality of leads of the first IC package with a first plurality of lands formed on the first surface of the main circuit board; and
   a second plurality of connection portions for connecting a plurality of leads of the second IC package with a second plurality of lands formed on the second surface of the main circuit board, wherein the first IC package opposes the second IC package and the first plurality of connection portions on the first surface of the main circuit board opposes the second plurality of connection portions on the second surface of the main circuit board.

12. The card type semiconductor device of claim 11, wherein a portion of the second plurality of connection portions corresponding to a side of the second IC package opposes a portion of the first plurality of connection portions corresponding to a side of the first IC package.

13. The card type semiconductor device of claim 11, wherein the second plurality of connection portions corresponding to all four sides of the second IC package opposes the first plurality of connection portions corresponding to all four sides of the first IC package.

14. The card type semiconductor device of claim 11, wherein the first and second IC packages have electronic components that operate in conjunction with one another.

15. The card type semiconductor device of claim 14, wherein the first IC package contains a CPU and the second IC package contains an I/O system which operates with the CPU.

16. The card type semiconductor device of claim 11, wherein at lease one of the first IC package and the second IC package is a tape carrier package.

17. A card type semiconductor device, comprising:
   a first IC package;
   a second IC package, the first IC package and the second IC package being mounted on a first surface and a second surface of a printed circuit board, respectively, so that the first and second IC packages oppose each other, the first and second IC packages being connected to the first and second surfaces of the printed circuit board, respectively, through a die bonding, wherein the first IC package and the second IC package are thermally connected to each other through thermal via-holes bored through the printed circuit board so that heat is transferred between the first and the second IC packages;
   an other circuit board coupled to the printed circuit board; and
   a card-shaped thin housing for enclosing the printing circuit board and the other circuit board.

18. The card type semiconductor device of claim 17, wherein leads of the first and second IC packages are coated with a thermally conductive resin.

19. The card type semiconductor device of claim 1, wherein a CPU is mounted on the sub-circuit-board.

20. The card type semiconductor device of claim 19, wherein the CPU and the electronic components mounted on the sub-circuit-board are coupled to only a bottom surface of the sub-circuit-board facing the main circuit board.

21. The card type semiconductor device of claim 1, wherein the pair of connectors includes a female connector and a male connector.

22. A card type semiconductor device, comprising:
   a main circuit board having a first side and a second side, electronic components being mounted on the main circuit board on both the first and second sides, the electronic components on the first side of the main circuit board opposing the electronic components on the second side of the main circuit board;
   a sub-circuit-board coupled to the main circuit board mounted with electronic components;
   a notch portion formed in a side edge portion of the main circuit board;
   a flexible printed circuit connected to the main circuit board and the sub-circuit-board through the notch portion to minimize curvature of the flexible printed circuit and minimize stress on the main circuit board and the sub-circuit-board; and
   a card-shaped thin housing for enclosing the main circuit board and the sub-circuit board.

23. The card type semiconductor device of claim 22, wherein a CPU is mounted on the main circuit board.

24. The card type semiconductor device of claim 22, wherein the flexible printed circuit is connected to one of the first and second surfaces of the main circuit board and the sub-circuit-board faces the main circuit board by bending the flexible printed circuit.

25. The card type semiconductor device of claim 22, wherein the main circuit board and the sub-circuit-board are fixed together into one unit by a spacer device so that the main circuit faces the sub-circuit-board.

26. The card type semiconductor device of claim 22, wherein at least a surface of the card-shaped thin housing is made of a metal plate protruding outwardly.

27. The card type semiconductor device of claim 22, further comprising a connector having a large number of terminals for connecting to an external apparatus.

28. The card type semiconductor device of claim 27, wherein the large number of terminals are arranged into a plurality of rows, and the plurality of rows are divided into horizontally asymmetric portions by a plurality of ribs, three terminals of one of the plurality of rows being an R-signal terminal, a G-signal terminal and a B-signal terminal and three terminals of an adjacent row of the plurality of rows being an R-return-signal terminal, a G-return-signal terminal and a B-return-signal terminal corresponding to the R-signal terminal, the G-signal terminal and the B-terminal, respectively, the R-return-signal terminal, the G-return-signal terminal and the B-return-signal terminal facing the R-signal terminal, the G-signal terminal and the B-signal terminal, respectively, and all six terminals being connected to an external CRT.

29. The card type semiconductor device of claim 28, wherein the plurality of ribs prevent the connector from being erroneously connected to a mating connector.

30. The card type semiconductor device of claim 22, further comprising a second sub-circuit-board mounted on one of the first and second surfaces of the main circuit board, wherein an analog circuit is mounted on the second sub-circuit-board and a power supply terminal of the second sub-circuit-board is connected to a power supply line of the main circuit board.

31. The card type semiconductor device of claim 22, further comprising:
   a first IC package mounted on a first surface of the main circuit board and a second IC package mounted on a second surface of the main circuit board;

a first plurality of connection portions for connecting a plurality of leads of the first IC package with a first plurality of lands formed on the first surface of the main circuit board; and a second plurality of connection portions for connecting a plurality of leads of the second IC package with a second plurality of lands formed on the second surface of the main circuit board, wherein the first IC package opposes the second IC package and the first plurality of connection portions on the first surface of the main circuit board opposes the second plurality of connection portions on the second surface of the main circuit board.

32. The card type semiconductor device of claim 31, wherein a portion of the second plurality of connection portions corresponding to a side of the second IC package opposes a portion of the first plurality of connection portions corresponding to a side of the first IC package.

33. The card type semiconductor device of claim 31, wherein the second plurality of connection portions corresponding to all four sides of the second IC package opposes the first plurality of connection portions corresponding to all four sides of the first IC package.

34. The card type semiconductor device of claim 31, wherein the first and second IC packages have electronic components that operate in conjunction with one another.

35. The card type semiconductor device of claim 34, wherein the first IC package contains a CPU and the second IC package contains an I/O system which operates with the CPU.

36. The card type semiconductor device of claim 31, wherein at lease one of the first IC package and the second IC package is a tape carrier package.

37. The card type semiconductor device of claim 22, further comprising a CPU mounted on the main circuit board adjacent to the card-shaped thin housing.

38. The card type semiconductor device of claim 22, further comprising:

a plurality of other sub-circuit-boards having a plurality of other electronic components mounted on the plurality of other sub-circuit-boards, wherein at least a first and second ones of the plurality of other sub-circuit-boards are mounted on the first and second sides of the main circuit board, respectively, the first and second ones of the plurality of other sub-circuit-boards being mounted opposing each other so that mounting positions of the first and second ones of the plurality of other sub-circuit-boards are symmetric with respect to the main circuit board the card-shaped thin housing also enclosing the plurality of sub-circuit-boards.

* * * * *